US012019031B2

(12) United States Patent  
Meyer et al.

(10) Patent No.: US 12,019,031 B2  
(45) Date of Patent: Jun. 25, 2024

(54) CLEAVED SEMICONDUCTOR WAFER IMAGING SYSTEM

(71) Applicant: GlobalWafers Co., Ltd., Hsinchu (TW)

(72) Inventors: Benjamin Michael Meyer, Defiance, MO (US); Justin Scott Kayser, Wentzville, MO (US); John F. Valley, Lake Oswego, OR (US); James Dean Eoff, Montgomery, MO (US); Vandan Tanna, O'Fallon, MO (US); William L Luter, St. Charles, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 12 days.

(21) Appl. No.: 17/447,524

(22) Filed: Sep. 13, 2021

(65) Prior Publication Data

US 2022/0084857 A1   Mar. 17, 2022

Related U.S. Application Data

(60) Provisional application No. 62/706,895, filed on Sep. 16, 2020, provisional application No. 62/706,894, (Continued)

(51) Int. Cl.
*G06T 7/12* (2017.01)
*G01N 21/95* (2006.01)
(Continued)

(52) U.S. Cl.
CPC ....... *G01N 21/9503* (2013.01); *G06T 7/0004* (2013.01); *G06T 7/12* (2017.01);
(Continued)

(58) Field of Classification Search
None
See application file for complete search history.

(56) References Cited

U.S. PATENT DOCUMENTS 5,949,584 A   9/1999  White et al.
2001/0028452 A1* 10/2001  Yoneda ............. G01N 21/8806
                                                        356/237.2
(Continued)

FOREIGN PATENT DOCUMENTS

CN    101714498 B  *  8/2013
CN    108687979 A  *  10/2018  ........... B28D 5/0058

OTHER PUBLICATIONS

English Machine Translation of (CN 101714498 B).*
English Machine Translation of (CN 108687979 A).*

*Primary Examiner* — Mohammed Jebari
(74) *Attorney, Agent, or Firm* — Armstrong Teasdale LLP

(57) ABSTRACT

A semiconductor wafer processing system for processing a semiconductor wafer includes a semiconductor wafer processing station for processing the semiconductor wafer and a semiconductor wafer imaging system that images the semiconductor wafer after the semiconductor wafer processing station processes the semiconductor wafer. The semiconductor wafer imaging system includes shroud panels defining a black box, a camera positioned in the black box for imaging the semiconductor wafer, and an illumination panel for directing diffuse light to the semiconductor wafer. A portion of the diffuse light is reflected off the semiconductor wafer and the camera images the semiconductor wafer by detecting the reflected diffuse light.

20 Claims, 22 Drawing Sheets

Related U.S. Application Data filed on Sep. 16, 2020, provisional application No. 62/706,897, filed on Sep. 16, 2020.

(51) Int. Cl.

| | |
|---|---|
| *G06T 7/00* | (2017.01) |
| *H01L 21/66* | (2006.01) |
| *H01L 21/67* | (2006.01) |
| *H01L 21/78* | (2006.01) |
| *H04N 23/56* | (2023.01) |
| *G01N 21/88* | (2006.01) |

(52) U.S. Cl.
CPC .. *H01L 21/67092* (2013.01); *H01L 21/67288* (2013.01); *H01L 21/78* (2013.01); *H01L 22/12* (2013.01); *H04N 23/56* (2023.01); *G01N 2021/8812* (2013.01); *G01N 2021/8887* (2013.01); *G06T 2207/20056* (2013.01); *G06T 2207/30148* (2013.01)

(56) References Cited

U.S. PATENT DOCUMENTS

| | | |
|---|---|---|
| 2004/0012775 A1 | 1/2004 | Kinney et al. |
| 2006/0176548 A1* | 8/2006 | Terada ................. G01N 21/956 |
| | | 359/368 |
| 2015/0287625 A1* | 10/2015 | Fujimoto .......... H01L 21/67253 |
| | | 382/151 |
| 2017/0244936 A1 | 8/2017 | Koga et al. |
| 2019/0213729 A1* | 7/2019 | Kato .................... G02B 6/0073 |
| 2019/0242830 A1* | 8/2019 | Kato .................... G02B 3/0056 |
| 2020/0182923 A1* | 6/2020 | Kobayashi ........ H01L 21/67253 |

\* cited by examiner

CLEAVED SEMICONDUCTOR WAFER IMAGING SYSTEM

CROSS-REFERENCE TO RELATED APPLICATION

This application claims priority to U.S. Provisional Patent Application No. 62/706,895 filed on Sep. 16, 2020, U.S. Provisional Patent Application No. 62/706,894 filed on Sep. 16, 2020, and U.S. Provisional Patent Application No. 62/706,897 filed on Sep. 16, 2020, the entire disclosures of which are hereby incorporated by reference in their entirety.

FIELD

The field of the disclosure relates to imaging semiconductor substrates and, in particular, methods and systems for imaging cleaved wafers.

BACKGROUND

Semiconductor wafers are commonly used in the production of integrated circuit (IC) chips on which circuitry are printed. The circuitry is first printed in miniaturized form onto surfaces of the wafers, and the wafers are then broken into circuit chips. During the manufacturing process, the wafers are processed and polished such that the front and back surfaces of each wafer have a reflective, mirror-like surface. To reduce manufacturing costs, the wafers are also imaged during the manufacturing process to detect defects on the surfaces of the wafers before the wafers are further processed.

Some imaging systems used in quality control systems image manufactured articles by reflecting light off of the article and detecting the reflected light with a camera. The cameras typically image a non-specular surface of the manufactured articles. However, because the surfaces of the wafers are specular, the light directed to the wafers must be diffuse, uniform light. Otherwise, the image captured by the imaging system will be a reflected image of the light source, not the features of the wafers.

Additionally, while some imaging systems image reflective surfaces of wafers, the imaging systems typically include large parabolic mirrors that increase the size of the imaging systems and limit where the imaging systems can be positioned within the manufacturing process. Specifically, the parabolic mirror substantially increases a height and width of the imaging system. The imaging system can only be positioned in locations with enough space to accommodate the large volume of the system. Suitable locations for the systems may disrupt the manufacturing process.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

One aspect of the present disclosure is directed to a semiconductor wafer imaging system for imaging a semiconductor wafer. The system includes shroud panels defining a black box, a camera positioned in the black box for imaging the semiconductor wafer, and an illumination panel for directing diffuse light to the semiconductor wafer. A portion of the diffuse light is reflected off the semiconductor wafer and the camera images the semiconductor wafer by detecting the reflected diffuse light.

Another aspect of the present disclosure is directed to a black box for imaging a semiconductor wafer. The black box includes shroud panels defining an upper chamber and a lower chamber. A support plate separates the upper chamber from the lower chamber. A bottom shroud panel at least partially defines the lower chamber and defines a wafer opening. The support plate defines a camera opening. The black box further includes a camera positioned in the upper chamber for imaging the semiconductor wafer and an illumination panel for directing diffuse light to the semiconductor wafer. The diffuse light is transmitted to the semiconductor wafer through the wafer opening and a portion of the diffuse light is reflected off the semiconductor wafer through the wafer opening and the camera opening. The camera images the semiconductor wafer by detecting the reflected diffuse light.

Yet another aspect of the present disclosure is directed to a semiconductor wafer processing system for processing a semiconductor wafer. The system includes a semiconductor wafer processing station for processing the semiconductor wafer and a semiconductor wafer imaging system that images the semiconductor wafer after the semiconductor wafer processing station processes the semiconductor wafer. The semiconductor wafer imaging system includes shroud panels defining a black box, a camera positioned in the black box for imaging the semiconductor wafer, and an illumination panel for directing diffuse light to the semiconductor wafer. A portion of the diffuse light is reflected off the semiconductor wafer and the camera images the semiconductor wafer by detecting the reflected diffuse light.

Yet another aspect of the present disclosure is directed to a semiconductor wafer processing system for processing a semiconductor wafer. The system includes a first manufacturing line for processing a first semiconductor wafer and including a first semiconductor wafer processing station for processing the first semiconductor wafer. The system further includes a second manufacturing line for processing a second semiconductor wafer and including a second semiconductor wafer processing station for processing the second semiconductor wafer. The second manufacturing line intersects the first manufacturing line at a common location. The system further includes a semiconductor wafer imaging system for imaging the first and second semiconductor wafers and positioned within the common location where the first and second manufacturing lines intersect. The semiconductor wafer imaging system images the first and second semiconductor wafers after the first and second semiconductor wafer processing stations process the first and second semiconductor wafers. The semiconductor wafer imaging system includes shroud panels defining a black box, a camera positioned in the black box for imaging the semiconductor wafer, and an illumination panel for directing diffuse light to the semiconductor wafer. A portion of the diffuse light is reflected off the semiconductor wafer and the camera images the semiconductor wafer by detecting the reflected diffuse light.

Yet another aspect of the disclosure is directed to a semiconductor wafer imaging station of a semiconductor wafer processing system for imaging a semiconductor wafer. The station includes a frame, a locating plate attached to the frame, and a black box movably attached to the locating plate. The black box includes shroud panels defining the black box, a camera positioned in the black box for imaging the semiconductor wafer, and an illumination panel for directing diffuse light to the semiconductor wafer. A portion of the diffuse light is reflected off the semiconductor wafer and the camera images the semiconductor wafer by detecting the reflected diffuse light. The station further includes an end effector for positioning the semiconductor wafer within a field of view of the camera.

Yet another aspect of the disclosure is directed to a method of detecting defects on a semiconductor wafer. The method includes directing diffuse light to the semiconductor wafer and reflecting the diffuse light off of the semiconductor wafer. The method further includes detecting the diffuse light with a camera to generate an image of the semiconductor wafer and analyzing the image to detect defects on the semiconductor wafer.

Yet another aspect of the disclosure is directed to a method of processing a semiconductor wafer. The method includes cleaving the semiconductor wafer in a cleaving station, positioning the semiconductor wafer within a field of view of a camera, and directing diffuse light to the semiconductor wafer. The method further includes reflecting the diffuse light off of the semiconductor wafer, detecting the diffuse light with the camera to generate an image of the semiconductor wafer, and analyzing the image to detect defects on the semiconductor wafer.

Yet another aspect of the disclosure is directed to a method of processing a semiconductor wafer using a semiconductor wafer processing system. The semiconductor wafer processing system includes a processing station and a semiconductor wafer imaging station. The method includes processing the semiconductor wafer in the processing station, positioning the semiconductor wafer within a field of view of a camera of the semiconductor wafer imaging station, and directing diffuse light to the semiconductor wafer. The method further includes reflecting the diffuse light off of the semiconductor wafer, detecting the diffuse light with the camera to generate an image of the semiconductor wafer, and analyzing the image to detect defects on the semiconductor wafer.

Yet another aspect of the disclosure is directed to a method of processing a semiconductor wafer using a semiconductor wafer processing system. The semiconductor wafer processing system includes a first manufacturing line, a second manufacturing line, and a semiconductor wafer imaging station positioned within a common location where the first and second manufacturing lines intersect. The first and second manufacturing lines each include processing stations for processing the semiconductor wafer. The method includes i) processing a first semiconductor wafer in the processing station of the first manufacturing line, ii) positioning the first semiconductor wafer within a field of view of a camera of the semiconductor wafer imaging station, and iii) directing diffuse light to the first semiconductor wafer. The method further includes iv) reflecting the diffuse light off of the first semiconductor wafer, v) detecting the diffuse light with the camera to generate an image of the first semiconductor wafer, and vi) analyzing the image to detect defects on the first semiconductor wafer. The method further includes vii) processing a second semiconductor wafer in the processing station of the second manufacturing line and viii) repeating steps ii through vi to image the second semiconductor wafer.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

Figure 1:
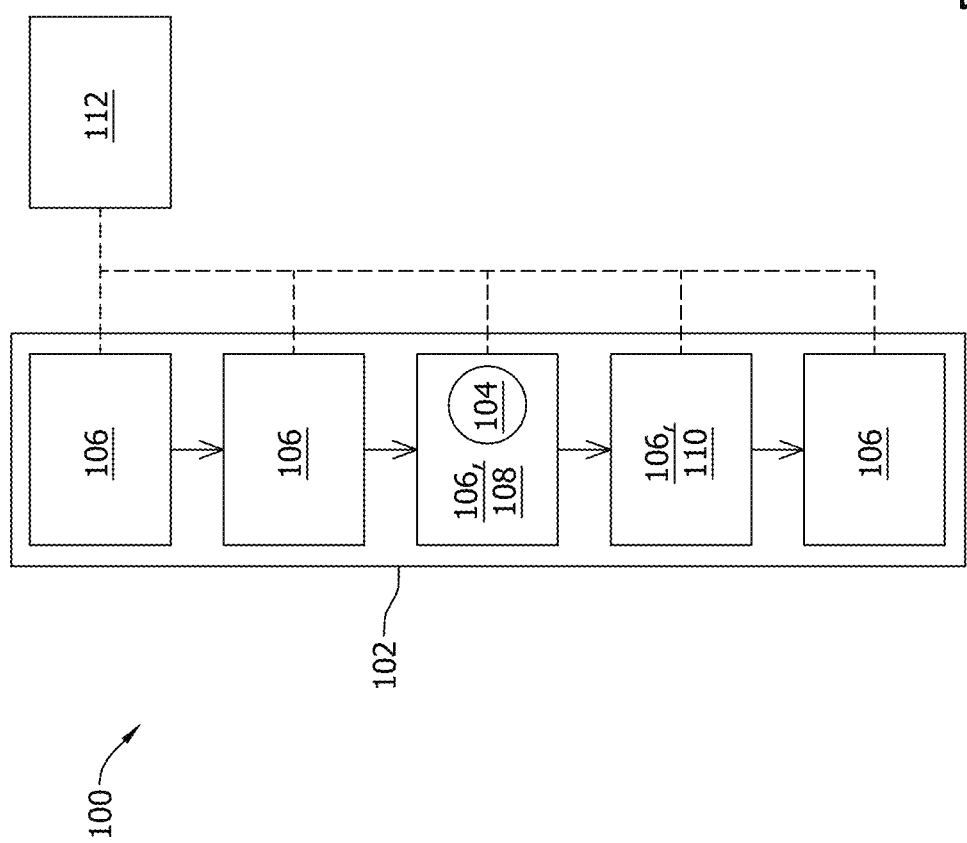
FIG. 1 is a schematic of a semiconductor wafer processing system.

Although specific features of various examples may be shown in some drawings and not in others, this is for convenience only. Any feature of any drawing may be referenced and/or claimed in combination with any feature of any other drawing.

Unless otherwise indicated, the drawings are meant to illustrate features of examples of the disclosure. These features are believed to be applicable in a variety of systems comprising one or more examples of the disclosure. The drawings are not meant to include all conventional features known by those of ordinary skill in the art to be required for the practice of the disclosed examples disclosed.

DETAILED DESCRIPTION

Semiconductor wafers (which may be referred to as semiconductor or silicon "wafers" or "substrates") are generally prepared from a single crystal ingot (e.g., a silicon ingot) formed by a crystal growing process which is sliced into individual wafers. Suitable crystal growing processes include the Czochralski process, the float zone process, the hydrothermal process, the Bridgeman process, the Kyropoulos process, and/or any other crystal growing process. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide. Each semiconductor wafer includes a central axis, a front surface, and a back surface parallel to the front surface. The front and back surfaces are generally perpendicular to the central axis. A circumferential edge joins the front and back surfaces.

Semiconductor wafers may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, a common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor wafer and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

In one example, a semiconductor wafer imaging system images wafers to detect defects in the wafers during the manufacturing process. The imaging system images wafers after the wafers have been cleaved to detect defects in the wafers formed during any upstream manufacturing process, including the cleaving process. If the semiconductor wafer imaging system detects defects in a wafer, the wafer is removed from the manufacturing process, reducing wafer production costs. The wafers have a reflective, mirror-like surface, and the semiconductor wafer imaging system images the wafer without imaging a light source reflected off of the reflective surface. Specifically, the semiconductor wafer imaging system includes a black box that surrounds a camera and an illumination panel. The black box minimizes reflections in the semiconductor wafer imaging system, and the illumination panel directs diffuse light toward the wafer. The diffuse light is reflected off of the wafer toward the camera. The camera detects the reflected diffuse light, and does not image the illumination panel because the light generated by the illumination panel is diffuse. Accordingly, the camera images the wafer, not the light source, enabling a controller to analyze the wafer for defects and reducing manufacturing costs.

With reference to FIG. 1, a semiconductor wafer processing system 100 includes a manufacturing line 102 for manufacturing semiconductor wafers 104. The manufacturing line 102 includes semiconductor wafer processing stations 106 for processing the wafer 104. The processing stations 106 include a cleaving station 108 and a semiconductor wafer imaging station or system 110 for imaging the wafer 104. In the illustrated embodiment, the imaging system 110 is positioned above the cleaving station 108 to image the wafers 104 after they have been cleaved by the cleaving station. The imaging system 110 images each wafer 104, and a controller 112 analyzes the images and detects defects in the wafers. If a wafer 104 includes defects, the wafer is discarded before further processing, reducing wafer production costs.

Figure 2:
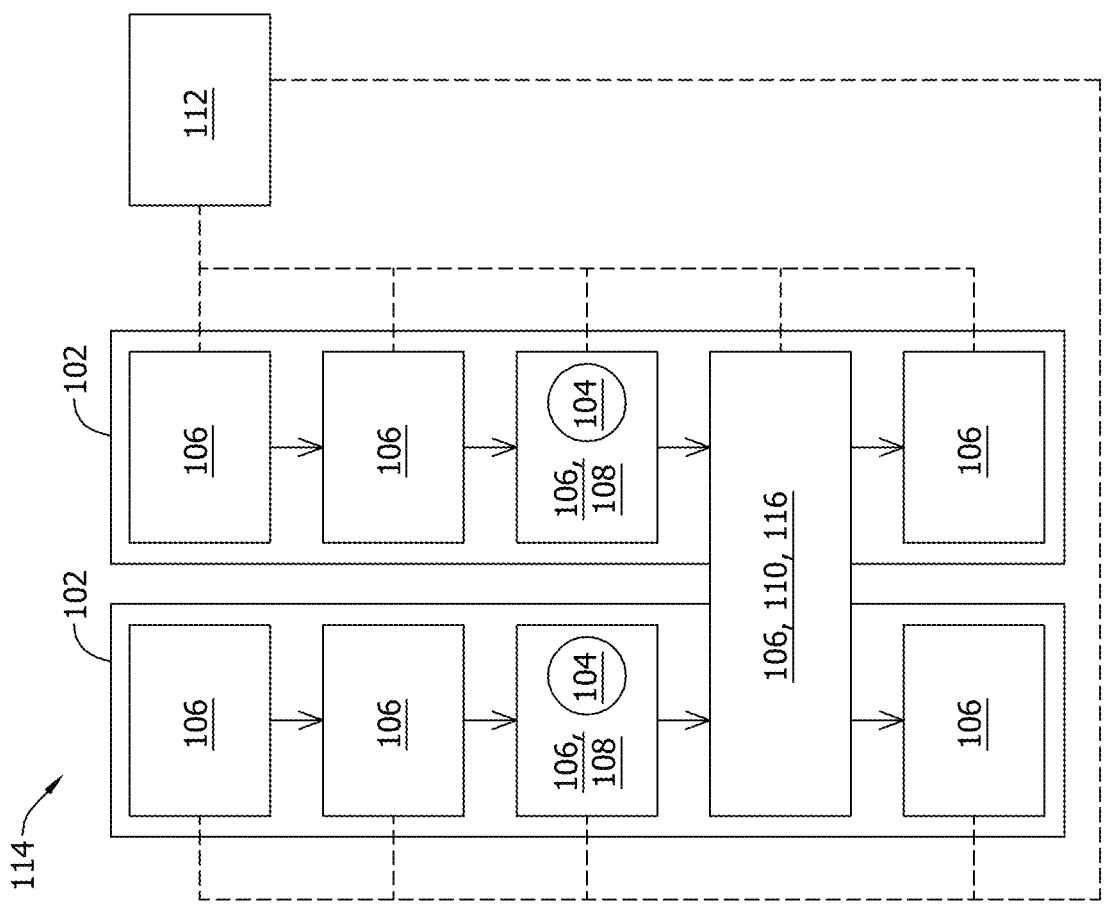
FIG. 2 is a schematic of an alternative semiconductor wafer processing system.

With reference to FIG. 2, an alternative semiconductor wafer processing system 114 includes two or more manufacturing lines 102 for manufacturing the wafers 104. Similar to processing system 100, each manufacturing line 102 includes processing stations 106 including cleave stations 108. The manufacturing lines 102 also include a common location 116 where the manufacturing lines intersect. The imaging system 110 is positioned at the common location 116 and images wafers 104 manufactured by all manufacturing lines 102 that intersect the common location. In the illustrated embodiment, the processing system 114 includes two manufacturing lines 102. However, in alternative embodiments, the processing system 114 may include any number manufacturing lines 102 that enable processing system 114 to operate as described herein. Additionally, in the embodiments illustrated in FIGS. 1 and 2, the imaging system 110 is positioned above or immediately downstream of the cleave station 108. In alternative embodiments, the imaging system 110 may be positioned at any location within processing systems 100 and 114 that enable the processing systems to operate as described herein.

Figure 3:
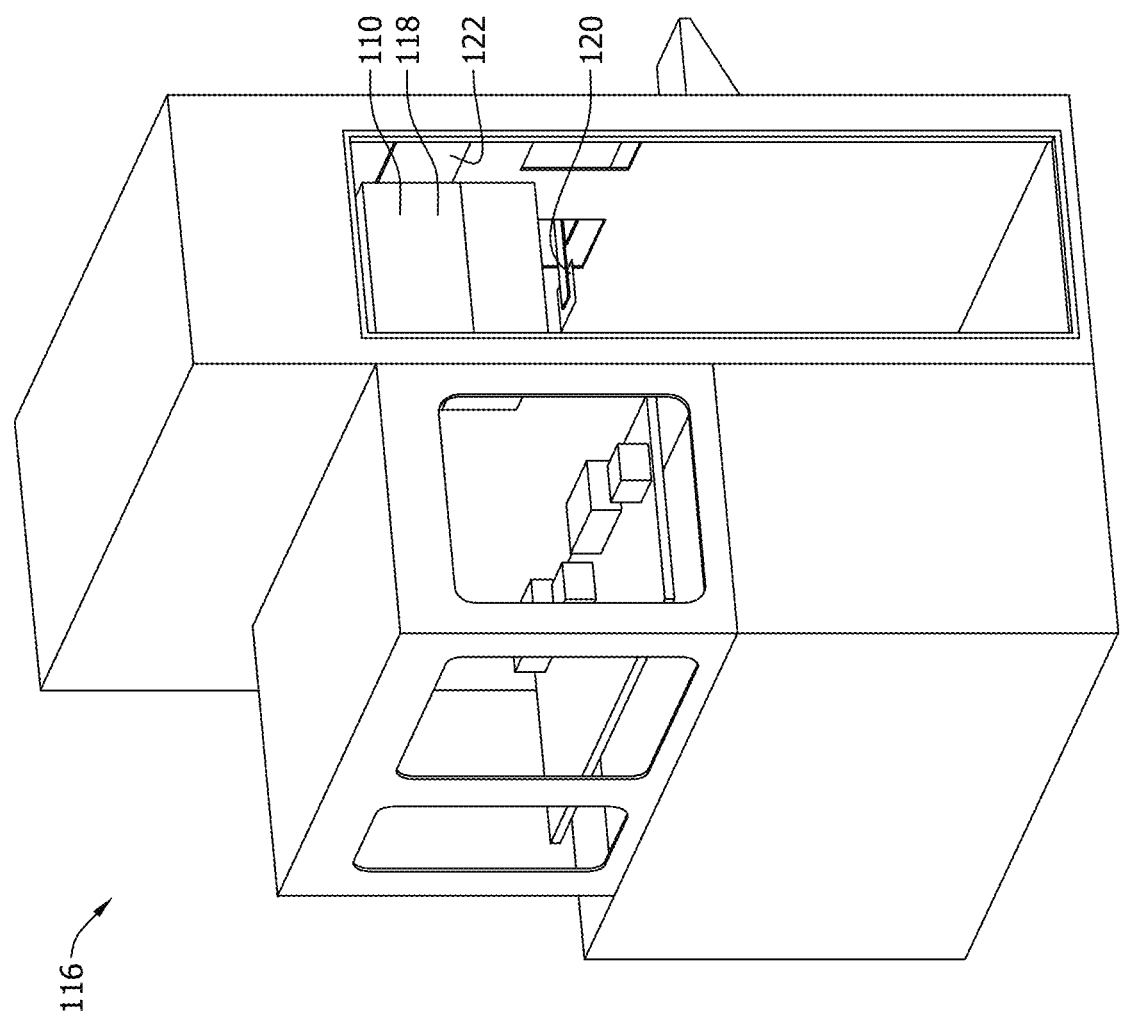
FIG. 3 is a perspective view of a semiconductor wafer imaging system positioned at a common location within the semiconductor wafer processing systems of FIGS. 1 and 2.
Figure 4:
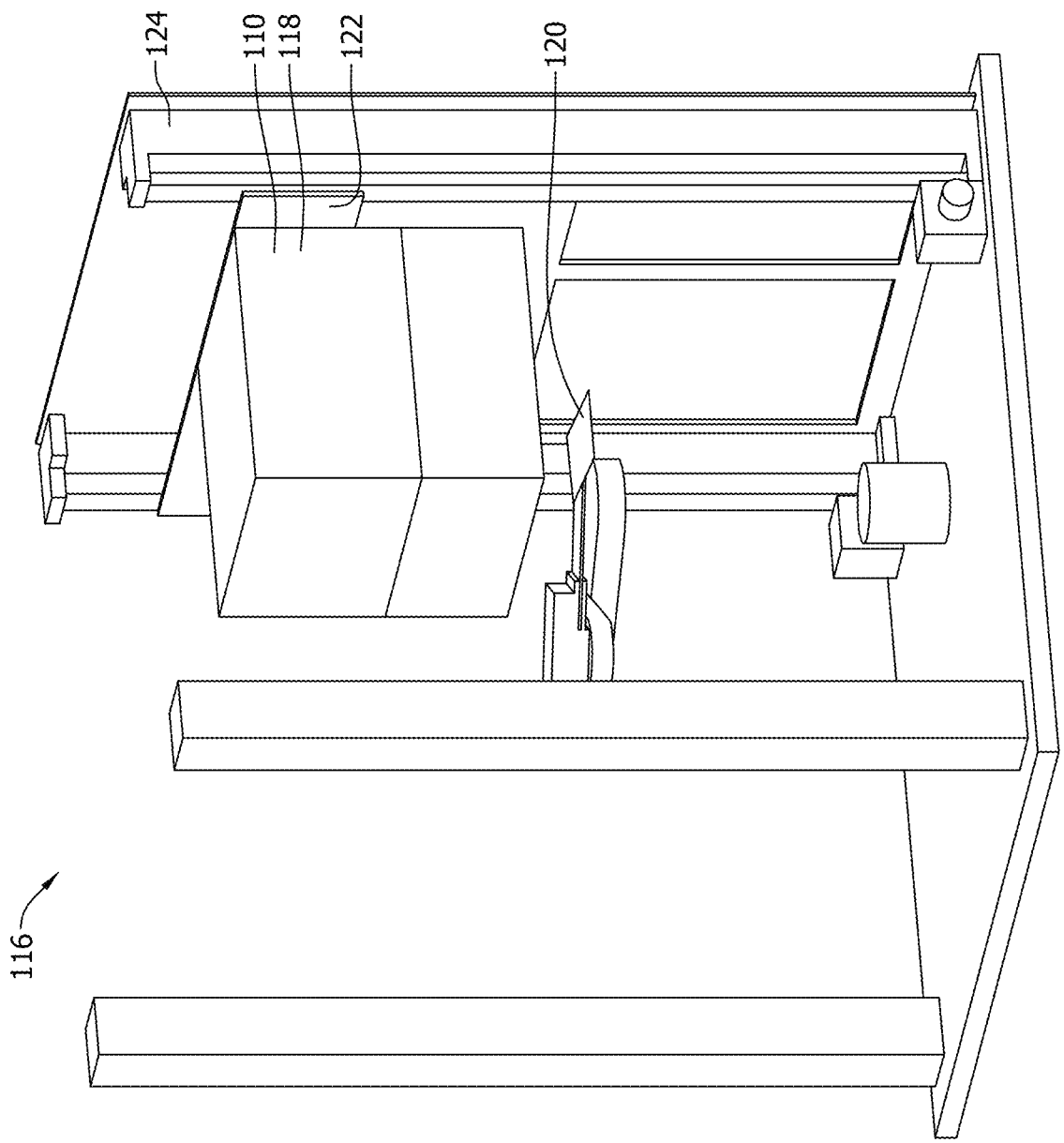
FIG. 4 is another perspective view of a semiconductor wafer imaging system positioned at a common location within the semiconductor wafer processing systems of FIGS. 1 and 2.

With reference to FIGS. 3 and 4, the imaging system 110 includes a black box 118, an end effector 120, and a locating plate 122. As described below, the black box 118 includes a camera for imaging the wafers 104. The locating plate 122 positions the black box 118 in the common location 116, and the end effector 120 positions the wafer 104 beneath the black box 118 for imaging. The locating plate 122 is attached to a frame 124, and the black box 118 is movably attached to the locating plate. A position of the black box 118 on the locating plate 122 can be adjusted to adjust the position of the black box 118. Additionally, the end effector 120 is movable relative to the black box 118 such that a position of the wafer 104 can be adjusted during imaging.

Figure 5:
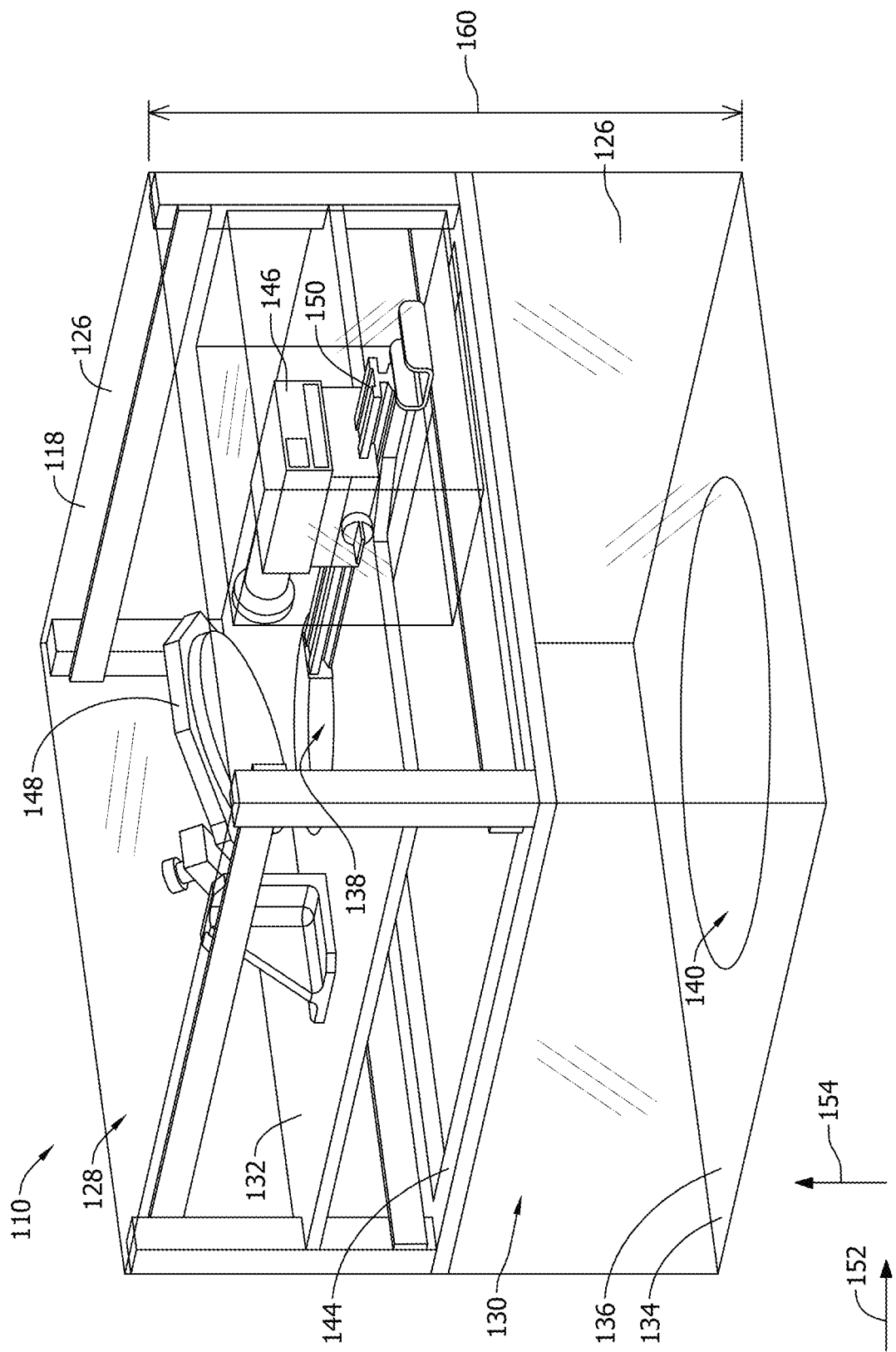
FIG. 5 is a perspective view of the semiconductor wafer imaging system shown in FIGS. 3 and 4 with transparent shrouds.

With reference to FIG. 5, shroud panels 126 define the black box 118. Specifically, the shroud panels 126 define an upper chamber 128 and a lower chamber 130. A support plate 132 is positioned within the black box 118 and separates the upper chamber 128 from the lower chamber 130. Additionally, a bottom shroud 134 defines a bottom 136 of the black box 118. The support plate 132 defines a support plate opening 138, and the bottom shroud 134 defines a bottom shroud opening 140. In the illustrated embodiment, the support plate opening 138 and the bottom shroud opening 140 are both circular, corresponding to the size and shape of the wafer 104. However, in alternative embodiments, the support plate opening 138 and the bottom shroud opening 140 are any shape that enables the imaging system 110 to operate as described herein. Additionally, the support plate opening 138 is aligned with the bottom shroud opening 140 such that the wafer 104 is visible through a direct, unobstructed line of sight 142 from the wafer to the upper chamber 128 when the wafer is positioned in the bottom shroud opening 140. The shroud panels 126 are suitably made of black anodized aluminum panels to minimize reflections in the black box 118. In alternative embodiments, the shroud panels 126 are made of any material that enables the black box 118 to operate as described herein.

The black box 118 includes an illumination panel 144 for directing diffuse light to the wafer 104. The illumination panel 144 is positioned in the lower chamber 130 and directs diffuse light through the bottom shroud opening 140 to the wafer 104 positioned in the bottom shroud opening. The diffuse light is then reflected off the wafer 104 through the support plate opening 138 and the bottom shroud opening 140 to the upper chamber 128. In the illustrated embodiment, the illumination panel 144 has a rectangular shape, and a shape of the lower chamber 130 conforms to the shape of the illumination panel. In alternative embodiments, the illumination panel 144 may have any shape that enables the semiconductor wafer imaging system 110 to operate as described herein including a circular shape and/or a polygon shape.

Figure 6:
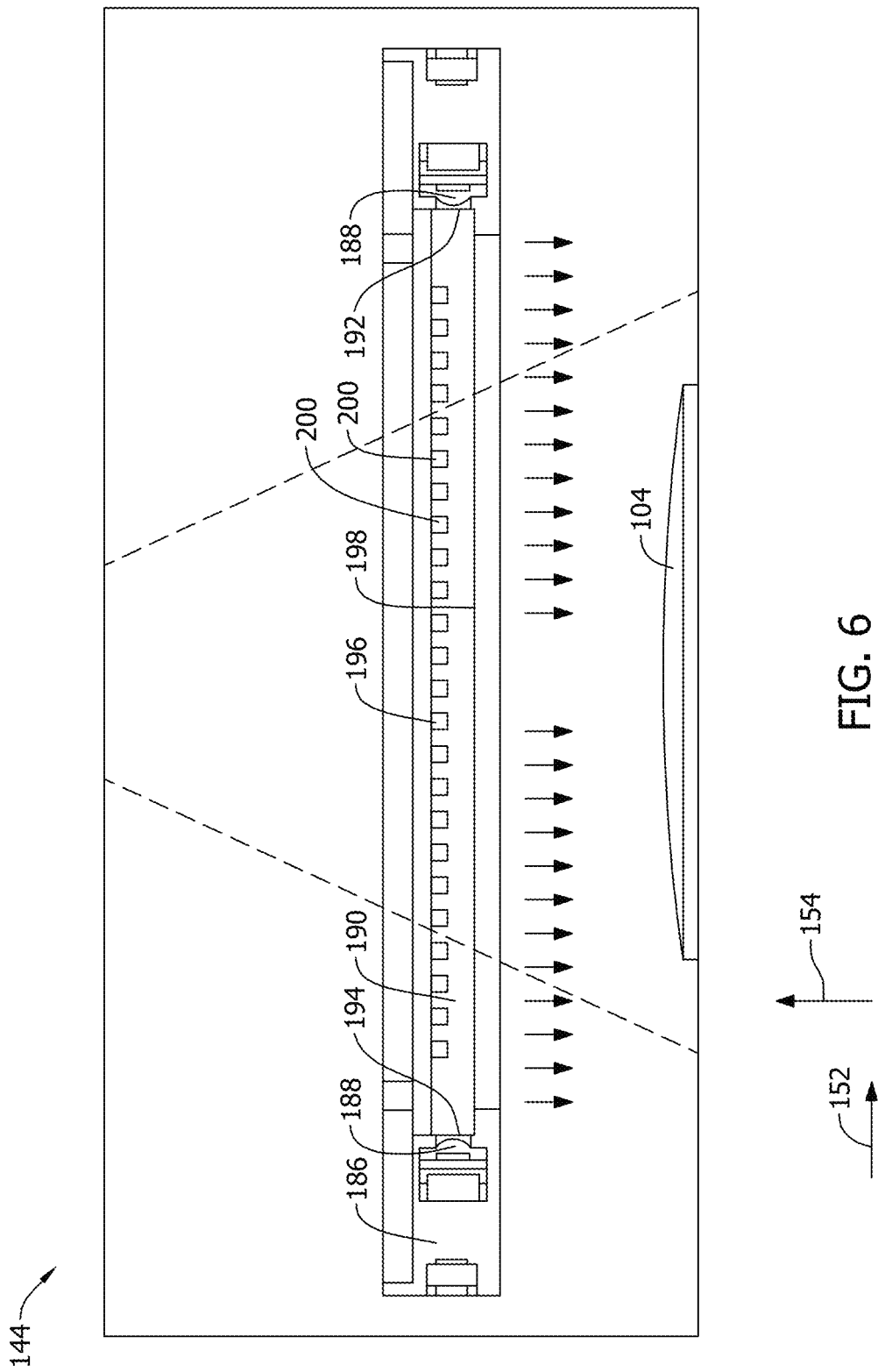
FIG. 6 is a sectional view of an illumination panel shown in FIG. 5.
Figure 7:
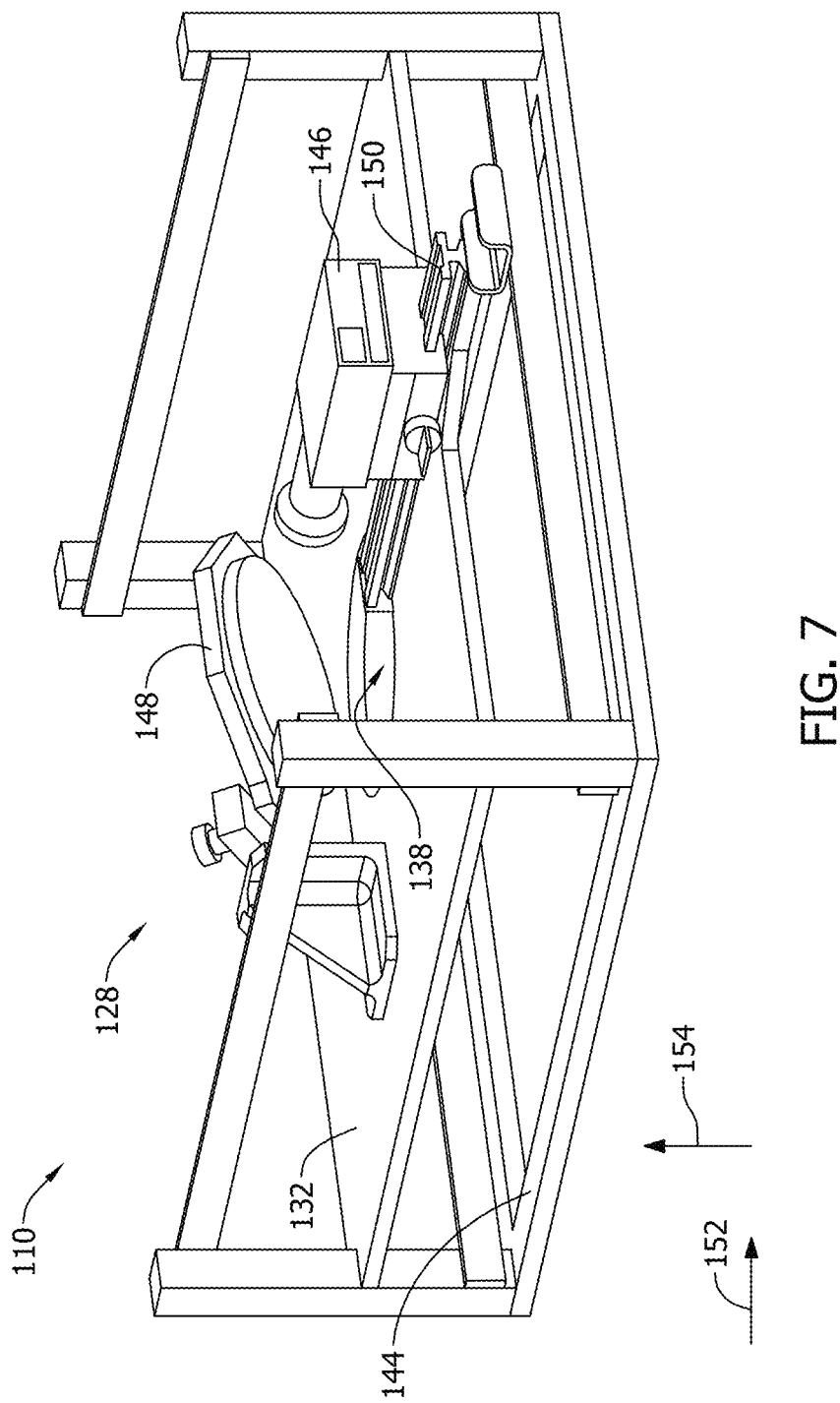
FIG. 7 is a perspective view of the semiconductor wafer imaging system shown in FIG. 5 with the shrouds removed.
Figure 8:
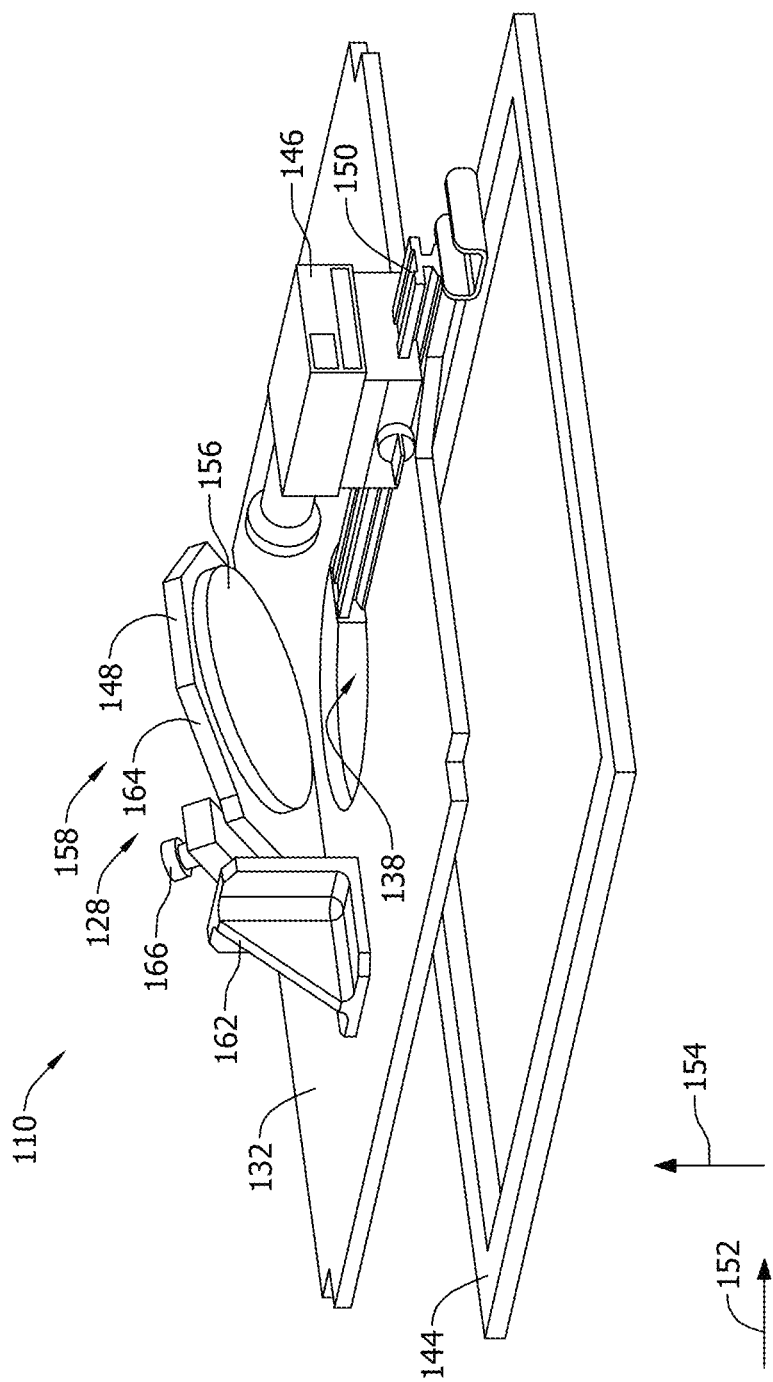
FIG. 8 is another perspective view of the semiconductor wafer imaging system shown in FIG. 5 with the shrouds and structural members removed.
Figure 9:
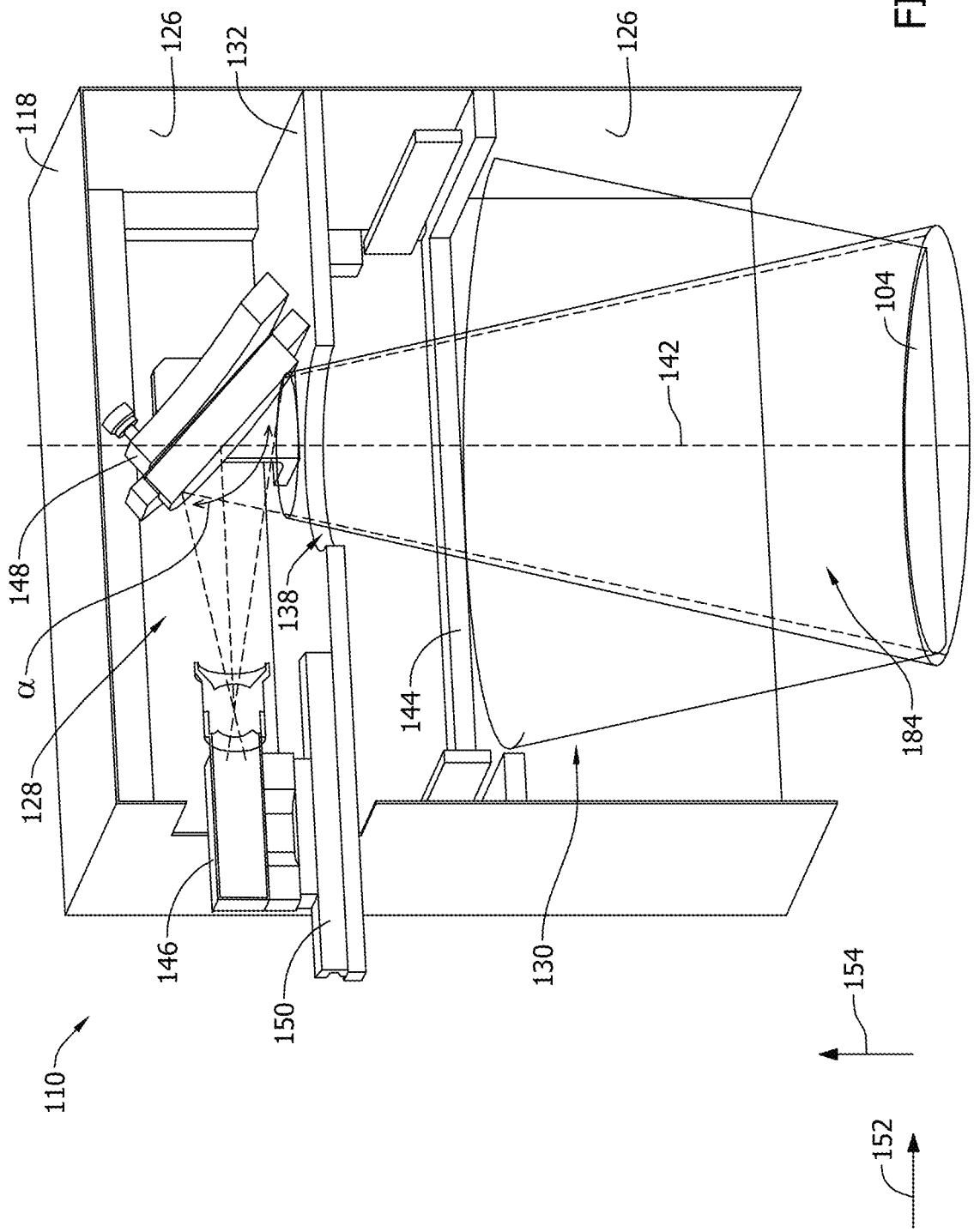
FIG. 9 is a sectional view of the semiconductor wafer imaging system shown in FIG. 5.
Figure 10:
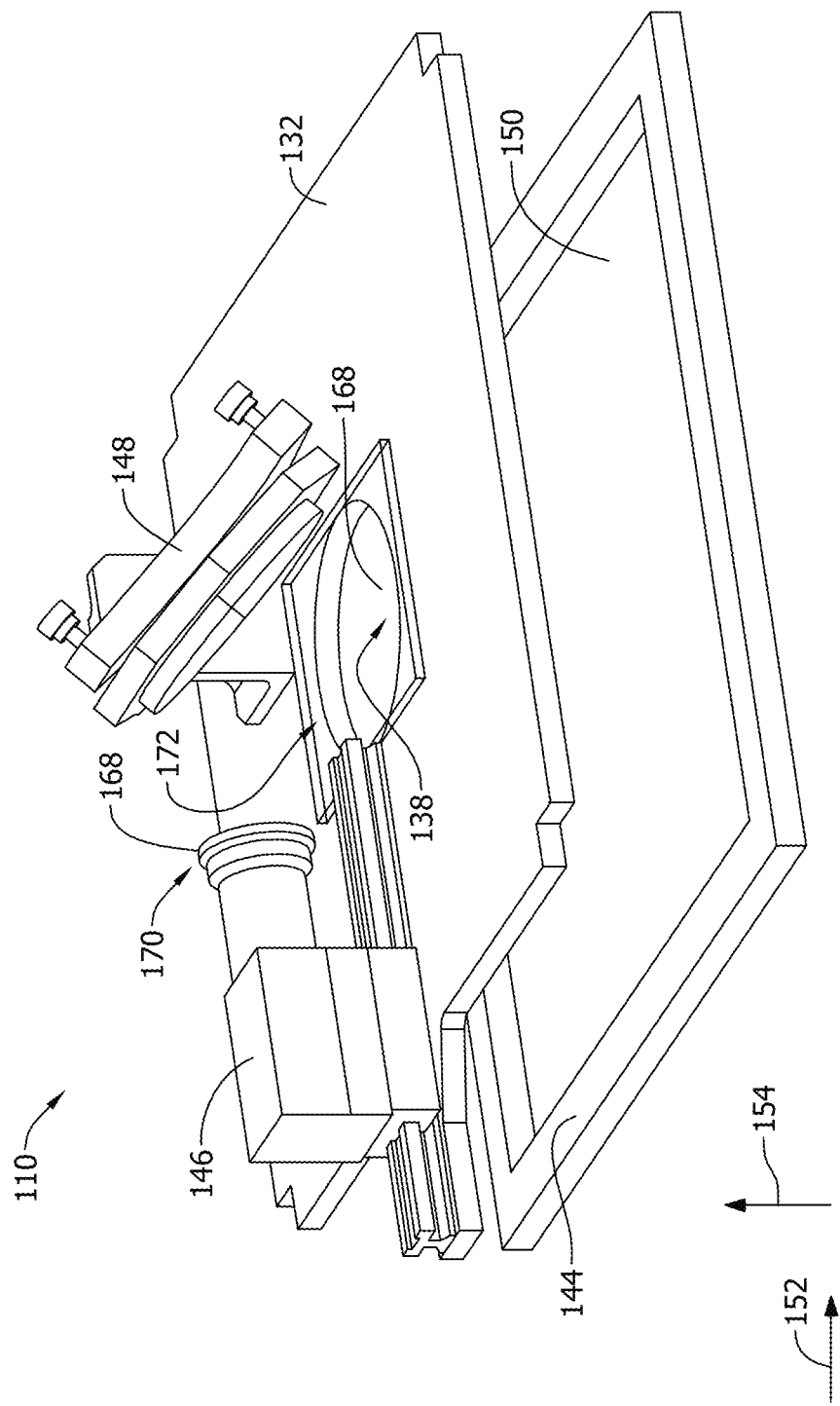
FIG. 10 is another perspective view of the semiconductor wafer imaging system shown in FIG. 5 showing filters with the shrouds and structural members removed.
Figure 11:
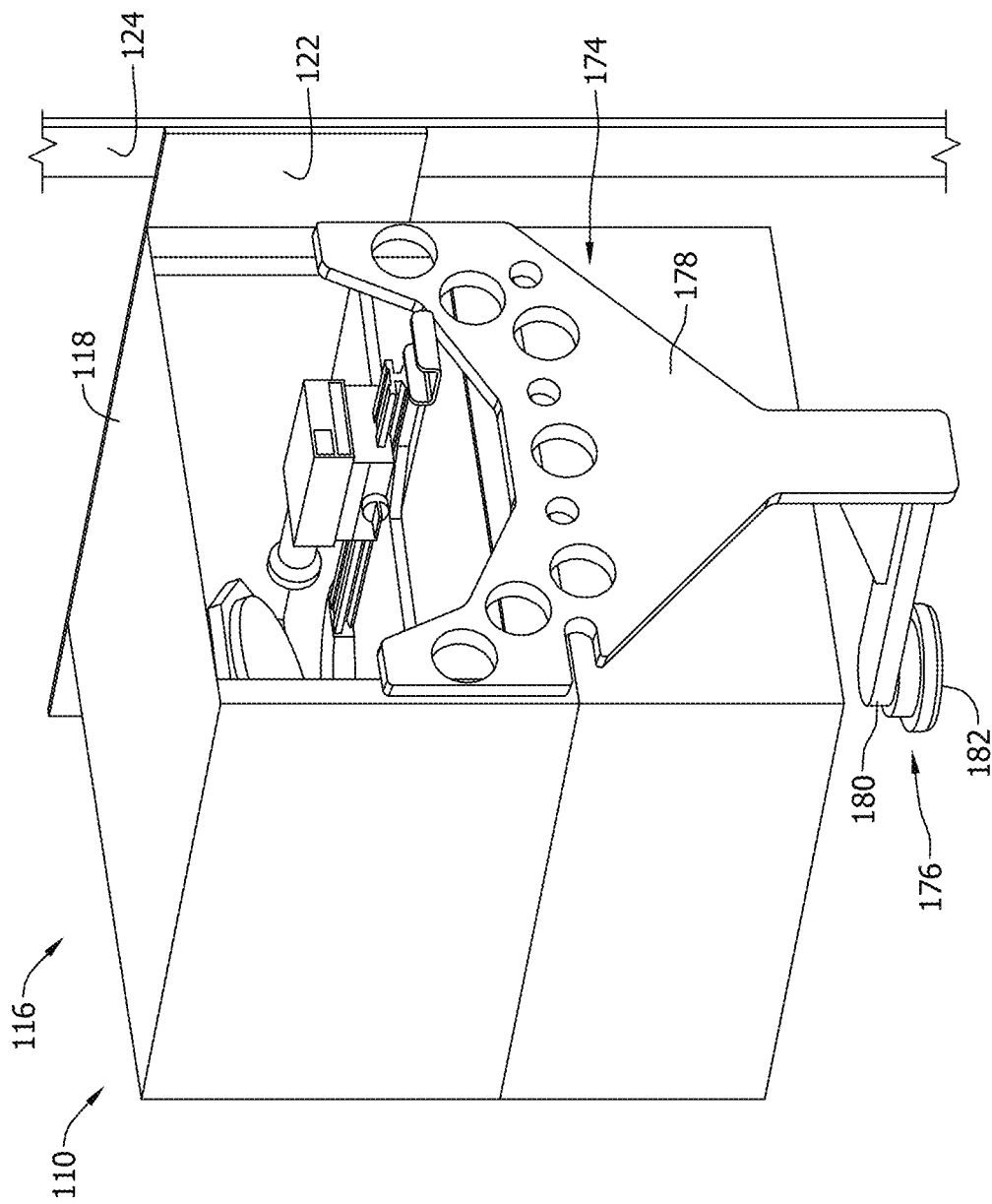
FIG. 11 is another perspective view of the semiconductor wafer imaging system shown in FIGS. 3 and 4 with an end effector positioner.

With reference to FIG. 6, the illumination panel 144 includes a frame 186, lights 188, and a transparent plate 190. The frame 186 has a rectangular shape to conform to the shape of the lower chamber 130. In the illustrated embodiment, the lights 188 are light-emitting diode (LED) lights. In alternative embodiments, the lights 188 may be any type of light that enables the semiconductor wafer imaging system 110 to operate as described herein. The lights 188 are attached to the frame 186 such that the lights direct visible light in a horizontal direction 152 through the transparent plate 190. The transparent plate 190 includes a first edge 192, a second edge 194, a top surface 196, a bottom surface 198, and reflectors 200.

The lights 188 direct the light into the first edge 192 of the transparent plate 190, and the light either exits the second edge 194 or is directed through the bottom surface 198 by the reflectors 200. The lights 188 substantially surround the transparent plate 190 such that the visible light emitted by the lights is scattered throughout the transparent plate, traveling and reflecting in all directions parallel to the top and bottom surfaces 196 and 198. The visible light will remain within the transparent plate 190 until it is directed downward by the reflectors 200. The top surface 196 is textured with a regular geometric array of the reflectors 200 to direct a portion of the visible light emitted by the lights 188 downward through the bottom surface 198. In the illustrated embodiment, the reflectors 200 include raised and/or depressed features, including holes and/or protrusions, formed in the transparent plate 190 that reflect, diffuse, and/or scatter the visible light downward. For example, the raised features formed in the transparent plate 190 may include pyramid or cone shaped protrusions extending from the transparent plate, and the depressed features formed in the transparent plate 190 may include holes that allow a portion of the reflected light to pass. The raised features and the depressed features are not aligned such that the reflections from the features do not interfere with each other. When the visible light hits one of the reflectors 200, it is scattered or reflected downward, intersecting the bottom surface 198 at a substantially normal incidence such that it is not internally reflected and exits the transparent plate 190. The reflectors 200 scatter the visible light such that it is directed downward toward the wafer 104 as diffuse light.

The diffuse light is reflected off the wafer 104 back up through the transparent plate 190. A portion of the reflected diffuse light is transmitted through the transparent plate 190 without hitting the reflectors 200 and is imaged by the camera as described below. However, the reflected diffuse light that hits the reflectors 200 is scattered or refracted such the camera cannot image the scattered diffuse light, producing an array of dark spots on an image of the wafer 104.

The black box 118 also includes a camera 146 for imaging the wafer 104. The camera 146 includes a monochrome digital camera for taking black and white digital photos of the wafer 104. The camera 146 is positioned in the upper chamber 128 and images the wafer 104 through the support plate opening 138 and the bottom shroud opening 140. In the illustrated embodiment and as described below, the camera 146 is positioned proximate a mirror 148 that reflects light reflected off the wafer 104 to the camera. In alternative embodiments, the black box 118 does not include the mirror 148, and the camera 146 is positioned in the upper chamber 128 to directly image the wafer 104.

The black box 118 further includes a slide lock 150 attached to the camera 146 for positioning the camera in the upper chamber 128. The camera 146 is movably attached to the slide lock 150 for positioning and repositioning the camera in the upper chamber 128. Specifically, as shown in FIGS. 5 and 7-10, the slide lock 150 is oriented in the horizontal direction 152 and slides the camera 146 in the horizontal direction to focus the camera on the wafer 104. In an alternative embodiment, the black box 118 does not include the mirror 148, and the slide lock 150 and the camera 146 are oriented in a vertical direction 154. The slide lock 150 slides the camera 146 in the vertical direction 154 to focus the camera on the wafer 104. In alternative embodiments, the camera 146 has an adjustable focus and the black box 118 does not include the slide lock 150.

The mirror 148 includes a flat mirror 156 attached to a mirror positioning system 158. The flat mirror 156 reflects diffuse light reflected off of the wafer 104 to the camera 146, and the mirror positioning system 158 positions the flat mirror 156 in the upper chamber 128. The mirror 148 redirects the diffuse light reflected off of the wafer 104 from the vertical direction 154 to the horizontal direction 152, enabling the camera 146 to be oriented in the horizontal direction, and reducing a height 160 of the black box 118. Thus, the mirror 148 enables the semiconductor wafer imaging system 110 to be compact and positioned within the semiconductor wafer processing system 100.

The mirror positioning system 158 includes a base 162, a mirror holder 164, and a plurality of mirror screws 166. The mirror holder 164 is rotatably attached to base 162, and the screws 166 attach the flat mirror 156 to the mirror holder. The screws 166 are rotated to adjust an angle α of the flat mirror 156 relative to the camera 146. Rotation of the screws 166 makes fine adjustments to the angle α. In alternative embodiments, the mirror positioning system 158 includes a slide similar to the slide lock 150.

The black box 118 may optionally include a filter 168 positioned in the upper chamber 128. The filter 168 may be a polarized filter, a color filter, a high pass filter, and/or any other type filter that enables the imaging system 110 to operate as described herein. The filter 168 is positioned at either a first location 170, on the camera 146, or a second location 172, over the support plate opening 138. The filter 168 creates a contrast between the wafer 104 and the surrounding environment, enabling the camera 146 to image the wafer. Specifically, the filter 168 reduces or eliminates reflections, enabling the camera 146 to image the wafer 104 rather than light or objects reflected by the wafer.

For example, if the filter 168 is a polarized filter, the filter creates a contrast between the wafer 104 and the surrounding environment using polarization. As described above, the light emitted from the illumination panel 144 is diffuse light that reflects off the mirror-like surface of the wafer 104 and passes back through the light emitted by the illumination panel. Any light reflected from other surfaces is reflected and scattered. Because diffuse, scattered light is not polarized, and reflected light is polarized, the filter 168 only allows transmission of the diffuse light reflected off of the wafer 104. Reflections from surrounding surfaces are reduced or not transmitted to the camera 146. Reducing or eliminating reflections enables the camera 146 to image the wafer 104 rather than light or objects reflected by the wafer.

Similarly, if the filter 168 is a color filter, the filter creates a contrast between the wafer 104 and the surrounding environment based on the wavelength of the light that reflects off the mirror-like surface of the wafer 104. The filter 168 selectively transmits light of different wavelengths. For example, the filter 168 may transmit long wavelengths only (long pass), short wavelengths only (short pass), or a band of wavelengths, blocking both longer and shorter wavelengths (band pass). Reflections from surrounding surfaces may a have a predetermined wavelength, and the filter 168 reduces or eliminates the reflections by absorbing light within the predetermined wavelength. Reducing or eliminating reflections enables the camera 146 to image the wafer 104 rather than light or objects reflected by the wafer.

Additionally, if the filter 168 is a high pass filter, the filter creates a contrast between the wafer 104 and the surrounding environment based on the wavelength of the light that reflects off the mirror-like surface of the wafer 104. Specifically, the filter 168 transmits light with a wavelength at or above 600 nanometers (nm) while absorbing light with wavelengths below 600 nm. Reflections from surrounding surfaces may a have a wavelength below 600 nm, and the filter 168 reduces or eliminates the reflections by absorbing light with a wavelength below 600 nm. Reducing or eliminating reflections enables the camera 146 to image the wafer 104 rather than light or objects reflected by the wafer.

The imaging system 110 includes an end effector positioner 174 attached to the black box 118 for calibrating a position 176 of the end effector 120. The end effector positioner 174 is detached from the black box 118 after the position 176 of the end effector 120 has been calibrated. The end effector positioner 174 includes a black box brace 178, an arm 180, and a puck 182. The end effector positioner 174 is attached to the black box 118 before the imaging system 110 images the wafer 104. The puck 182 is attached to the arm 180, the arm and the puck are attached to the black box brace 178, and the arm, the puck, and the black box brace are attached to the black box 118. The black box brace 178 and the arm 180 are sized and shaped to position the puck 182 below the bottom shroud opening 140 within a field of view 184 of the camera 146. The end effector 120 is positioned such that the end effector is attached to the puck 182, and the controller 112 records and calibrates the position 176 such that the end effector positions the wafer 104 at the position 176 for each imaging. The end effector positioner 174 is detached from the black box 118 after the position 176 has been calibrated.

Prior to manufacturing the wafer 104, the imaging system 110 is positioned within the processing system 100 and calibrated. Specifically, the locating plate 122 is attached to the frame 124, and the imaging system 110 is attached to the locating plate. More specifically, the black box 118 is attached to the locating plate 122.

The camera 146 and the mirror 148 are positioned and calibrated in the black box 118 when the imaging system 110 is positioned within the processing system 100 and calibrated. Specifically, an operator positions the mirror 148 in the upper chamber 128 of the black box 118 using the mirror positioning system 158. More specifically, the operator attaches the flat mirror 148 to the mirror holder 164 and attaches the mirror holder and the flat mirror to the base 162. Additionally, the operator also attaches the camera 146 to the slide lock 150 and positions the camera and the slide lock in the upper chamber 128 of the black box 118. The operator simultaneously adjusts the slide lock 150, the camera 146, and the flat mirror 156 to ensure that the field of view 184 of the camera is centered in the bottom shroud opening 140. More specifically, the operator simultaneously adjusts the screws 166, rotates the mirror holder 164, and slides the camera 146 on the slide lock 150 to ensure that the field of view 184 of the camera is centered in the bottom shroud opening 140.

The operator attaches the end effector positioner 174 to the black box 118 by attaching the puck 182 to the arm 180, attaching the puck and the arm to the black box brace 178, and attaching the puck, the arm, and the black box brace to the black box. The end effector positioner 174 is attached to the black box 118 such that the puck 182 is centered in the bottom shroud opening 140. The operator positions the end effector 120 such that the end effector is directly or indirectly attached to the puck 182. The controller 112 records and calibrates the position 176 of the end effector 120 such that the end effector positions the wafer 104 at the position 176 for each imaging. The operator removes the end effector positioner 174 from the black box 118.

Figure 13:
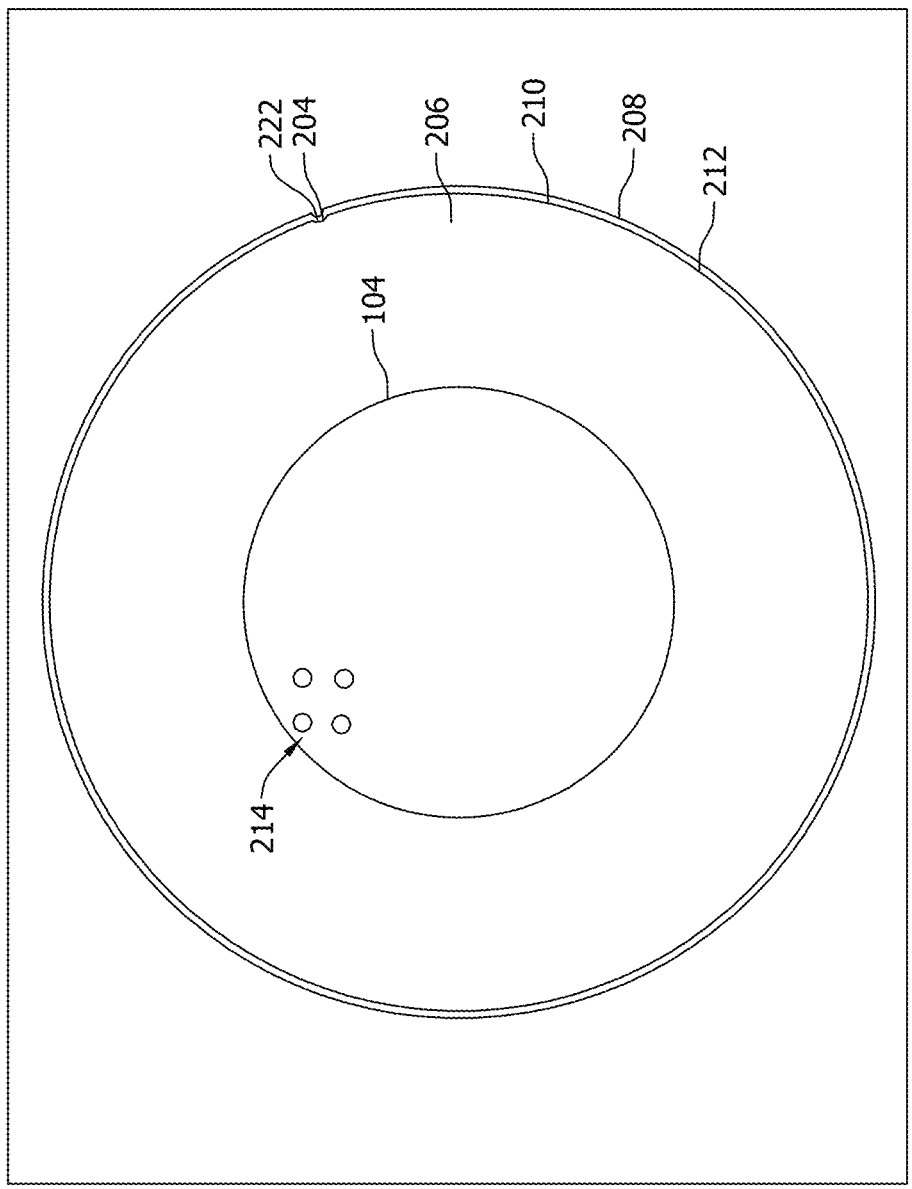
FIG. 13 is a schematic diagram of an image of a semiconductor wafer captured by the semiconductor wafer imaging system shown in FIGS. 3 and 4.

During operation, the wafer processing system 100 at least partially manufactures the wafer 104. Specifically, in the illustrated embodiment, the cleaving station 108 cleaves the wafer 104, and sends the wafer to the imaging system 110 for imaging. More specifically, after the cleave station 108 cleaves the wafer 104, the end effector 120 positions the wafer under the bottom shroud opening 140, and the camera 146 generates an image 202 (shown in FIG. 14, a schematic representation 203 of the image 202 is shown in FIG. 13) of the wafer. The image 202 of the wafer 104 is sent to the controller 112 for analysis as described below.

Figure 14:
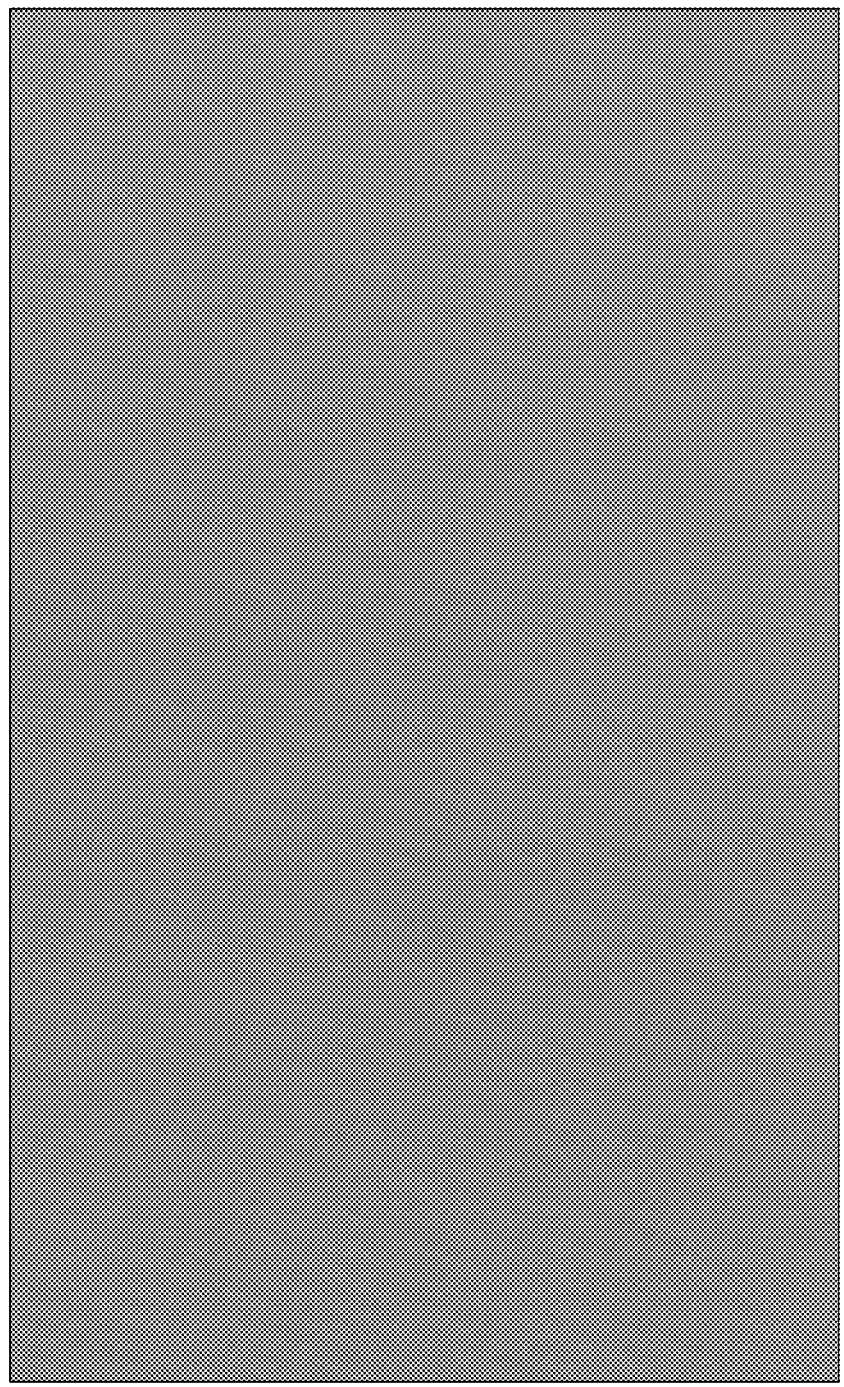
FIG. 14 is an image of a semiconductor wafer captured by the semiconductor wafer imaging system shown in FIGS. 3 and 4.

With reference to FIGS. 13 and 14, as shown in the image 202 and the schematic representation 203 of the image 202, the wafer 104 includes a base 204 and a transfer layer 206 deposited on the base. The base 204 has a wafer boundary 208, and the transfer layer 206 has a transfer layer boundary 210. The wafer boundary 208 and the transfer layer boundary 210 define a terrace width 212 therebetween. Additionally, the wafer 104 includes a notch 222. The controller 112 detects the base 204, the wafer boundary 208, the transfer layer 206, transfer layer boundary 210, and the terrace width 212 in the image 202 and analyzes the detected regions for defects in the wafer 104. Additionally, as discussed above, the arrangement of the reflectors 200 on the top surface 196 of the transparent plate 190 may generate a regular geometric array of periodic artifacts 214 in the image 202 (shown as a weave pattern on the image 202). Specifically, the reflectors 200 generate a grid pattern of periodic artifacts 214 in the image 202. The grid pattern of periodic artifacts 214 may include a regularly spaced, periodic array of out-of-focus points, slightly in-focus points, and/or dark spots.

Figure 18:
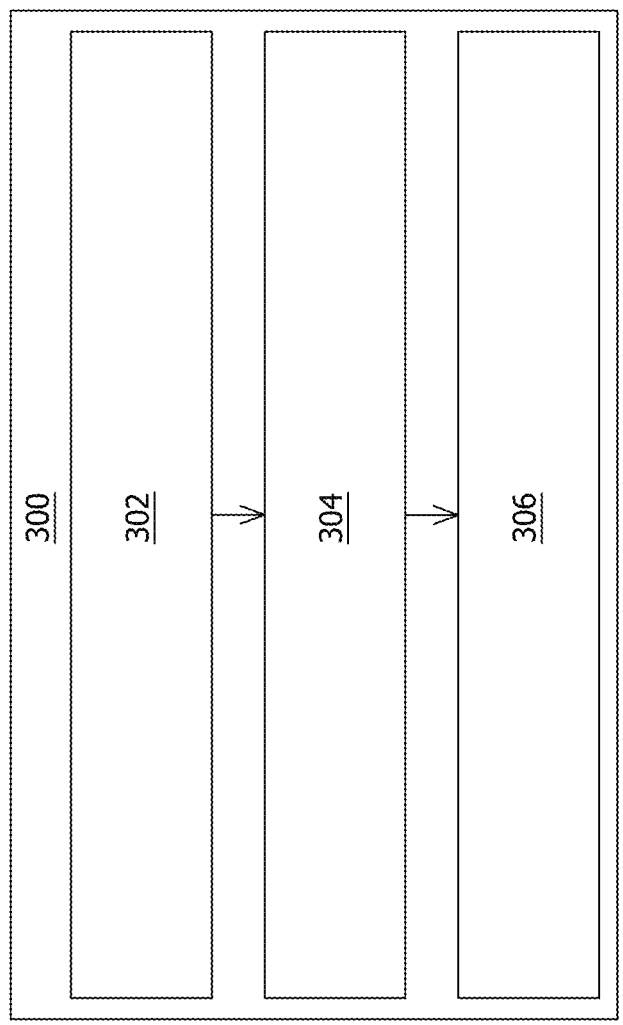
FIG. 18 is a diagram of a computer program for imaging and analyzing the semiconductor wafer.

The controller 112 includes a computer program 300 for imaging and analyzing the wafer 104. FIG. 18 is a diagram of the computer program 300 for imaging and analyzing the wafer 104. The computer program 300 includes an image capturing module 302, a data management module 304, and a data analysis module 306. The image capturing module 302 controls the semiconductor wafer imaging system 110 to position the wafer 104 within the bottom shroud opening 140, capture the image 202 of the wafer, and return the wafer to the semiconductor wafer processing system 100 for further processing. The data management module 304 records identification information for each wafer 104, stores the image 202 for analysis, and notifies the data analysis module 306 that the image 202 is ready for analysis. The data analysis module 306 analyzes the image 202, determines whether the wafer 104 is acceptable for further processing, and, if necessary, removes the wafer from the manufacturing process by controlling the semiconductor wafer processing system 100.

The computer program 300 may be a single program that includes all three modules, or multiple programs that interface with each other. For example, in a first embodiment, the computer program 300 is a single program that includes all three modules. In this embodiment, the computer program 300 images and analyzes the wafer 104 before another wafer is imaged and analyzed. The modules 302-306 are executed sequentially before another wafer 104 is imaged and analyzed.

In a second embodiment, the computer program 300 includes a single program that executes the modules 302-306 non-sequentially. For example, in this embodiment, the computer program 300 may execute the image capturing module 302 and the data management module 304 sequentially, but may not execute the data analysis module 306 until multiple wafers 104 have been imaged, allowing the controller 112 to analyze the wafers in batches. If there is an error in the data analysis module 306, the images 202 are saved by the data management module 304 for later analysis.

In a third embodiment, the computer program 300 includes multiple programs each including one or more modules 302-306. In this embodiment, the modules 302-306 are separated into separate programs such that the modules 302-306 may be executed non-sequentially. For example, a first computer program may include the image capturing module 302 and the data management module 304 while a second computer program may include the data analysis module 306. Additionally, the first and second computer programs may be executed on different controllers 112 or computing devices, allowing the controller to execute the image capturing module 302 and the data management module 304 without simultaneously analyzing the images 202. The third embodiment allows the manufacturing process to continue if the data analysis module 306 and/or the controller or computing device executing the data analysis module is temporarily unable to perform the analysis.

Figure 19:
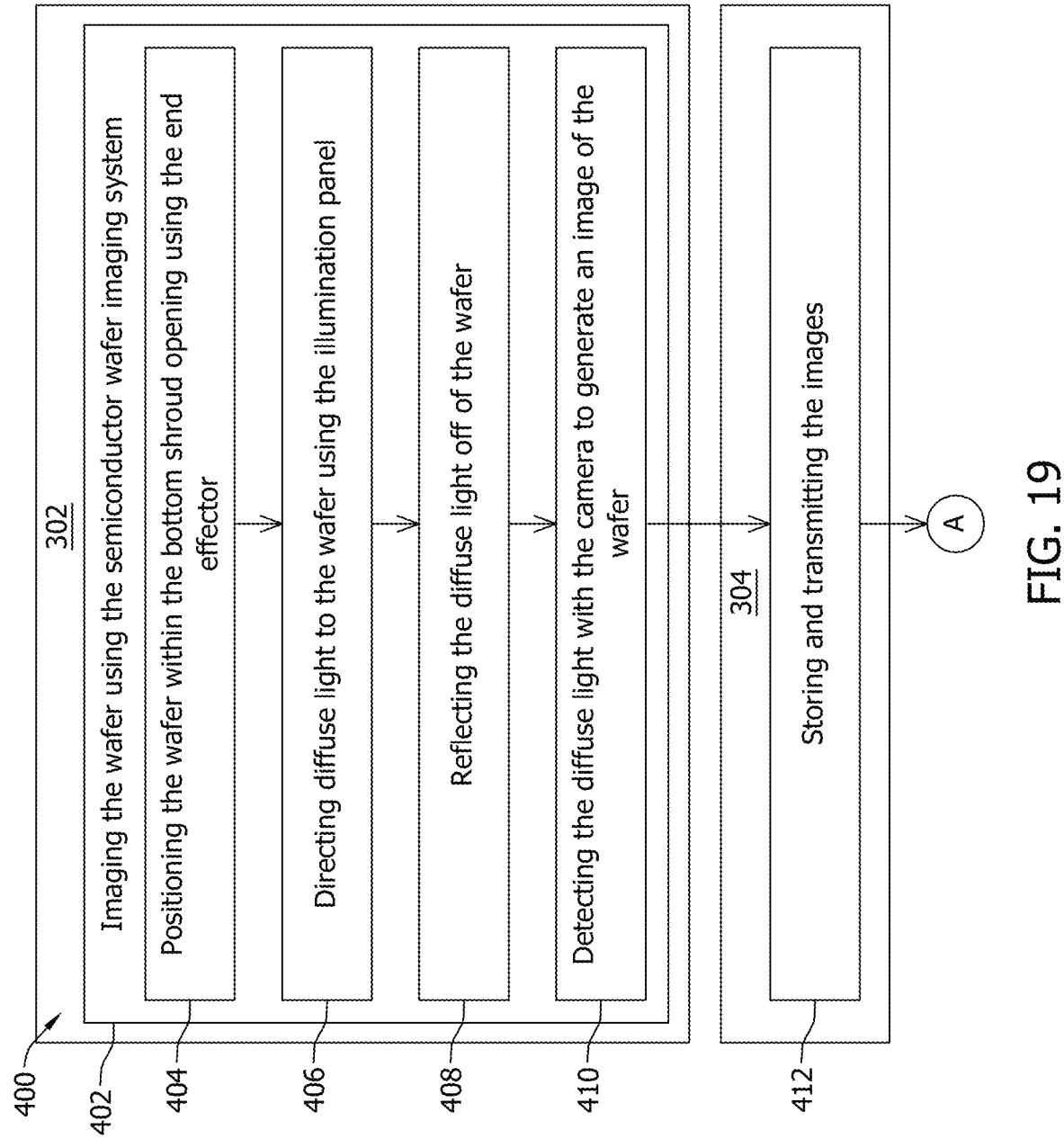
FIGS. 19-21 are a flow diagram of a method of imaging and analyzing the semiconductor wafer.
Figure 20:
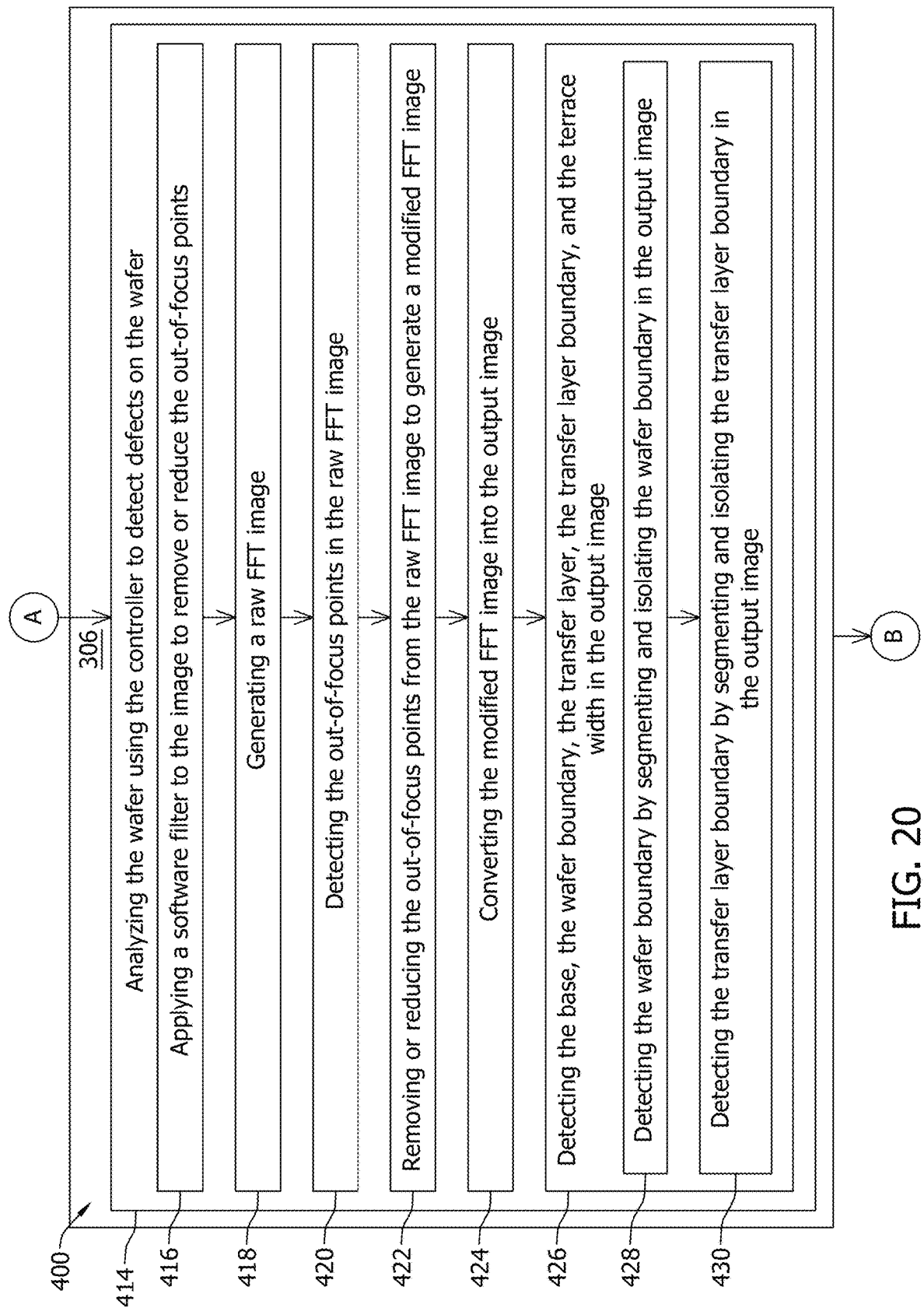
Figure 21:
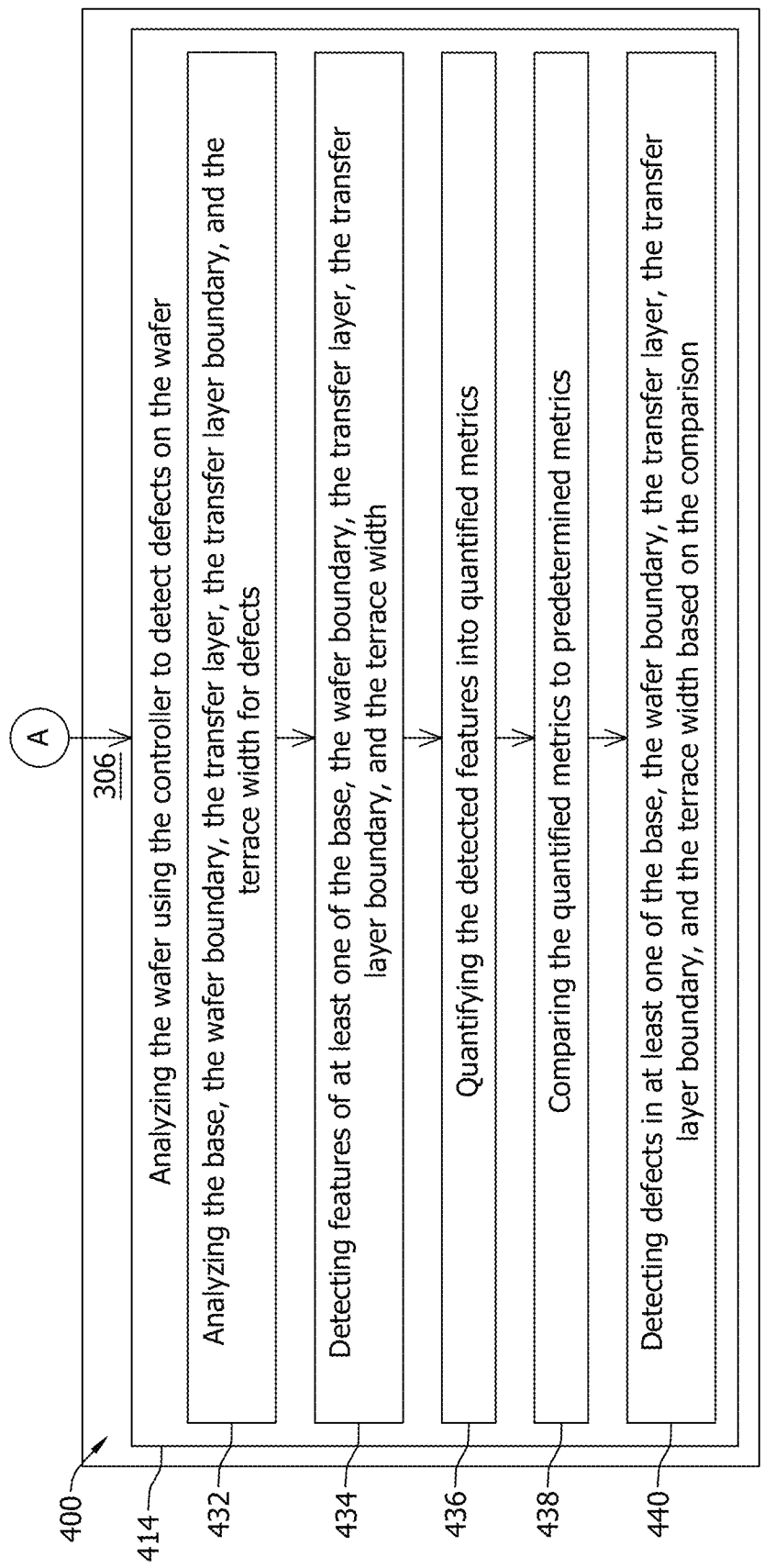

FIGS. 19-21 are a flow diagram of a method 400 of imaging and analyzing the wafer 104. Each module 302-306 performs certain steps of the method 400, and the modules may be executed non-sequentially. The method 400 includes imaging 402 the wafer 104 using the semiconductor wafer imaging system 110 as described above. Specifically, imaging 402 the wafer 104 using the semiconductor wafer imaging system 110 includes positioning 404 the wafer 104 within the bottom shroud opening 140 using the end effector 120, directing 406 diffuse light to the wafer 104 using the illumination panel 144, reflecting 408 the diffuse light off of the wafer, and detecting 410 the diffuse light with the camera 146 to generate an image 202 of the wafer.

The method 400 also includes storing and transmitting 412 the images. The images 202 are transmitted to the controller 112 and the controller analyzes the images before another wafer 104 is imaged. The controller 112 analyzes the images as soon as the images are received from the camera 146. However, the controller 112 and/or the analysis may create a bottleneck in the manufacturing process. In order to reduce manufacturing time, the camera 146 may transmit the images to the controller 112 along with a wafer identification number, and the controller may analyze the images as the wafer 104 proceeds through the manufacturing process.

The method 400 further includes analyzing 414 the wafer 104 using the controller 112 to detect defects on the wafer. The defects may include voids (missing areas within the transfer layer 206 that do not intersect the transfer layer boundary 210), edge voids (missing areas within the transfer layer 206 that intersect the transfer layer boundary 210), asymmetry of the terrace width 212, oversizing and undersizing the notch terrace width, alignment of the transfer layer 206 within the wafer 104, various metrics of area and symmetry of the terrace width, stains (darker and/or lighter regions), and/or any other defect within at least one of the base 204, the wafer boundary 208, the transfer layer 206, transfer layer boundary 210, and the terrace width 212. As discussed above, the arrangement of the reflectors 200 on the top surface 196 of the transparent plate 190 may generate the regular geometric array of periodic artifacts 214 in the image 202. In order to remove or reduce the periodic artifacts 214, analyzing 414 the wafer 104 using the controller 112 to detect defects on the wafer may include applying 416 a software filter to the image 202 to remove or reduce the periodic artifacts 214.

Figure 15:
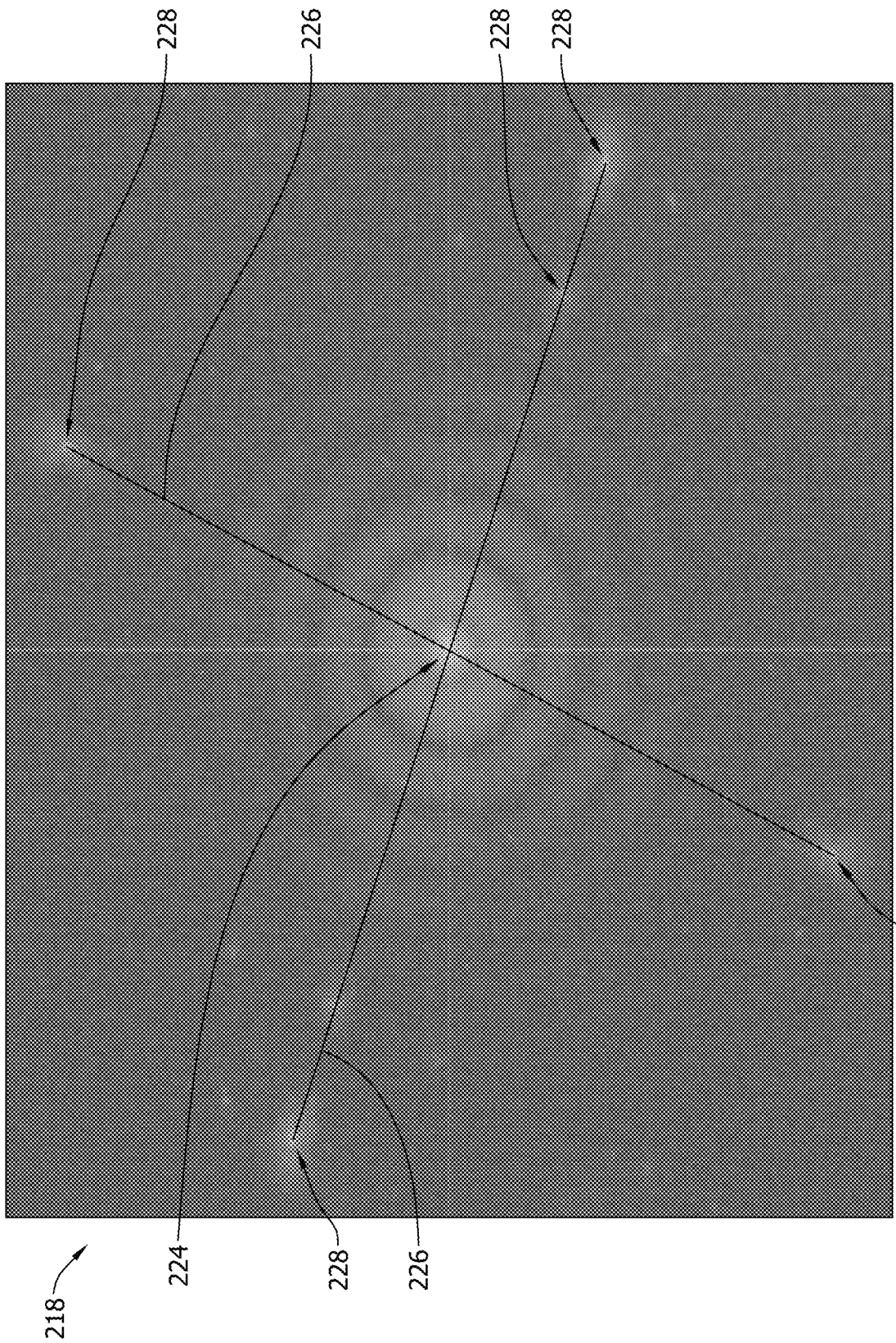
FIG. 15 is a raw Fast Fourier Transform (FFT) image of a semiconductor wafer generated by a controller.
Figure 16:
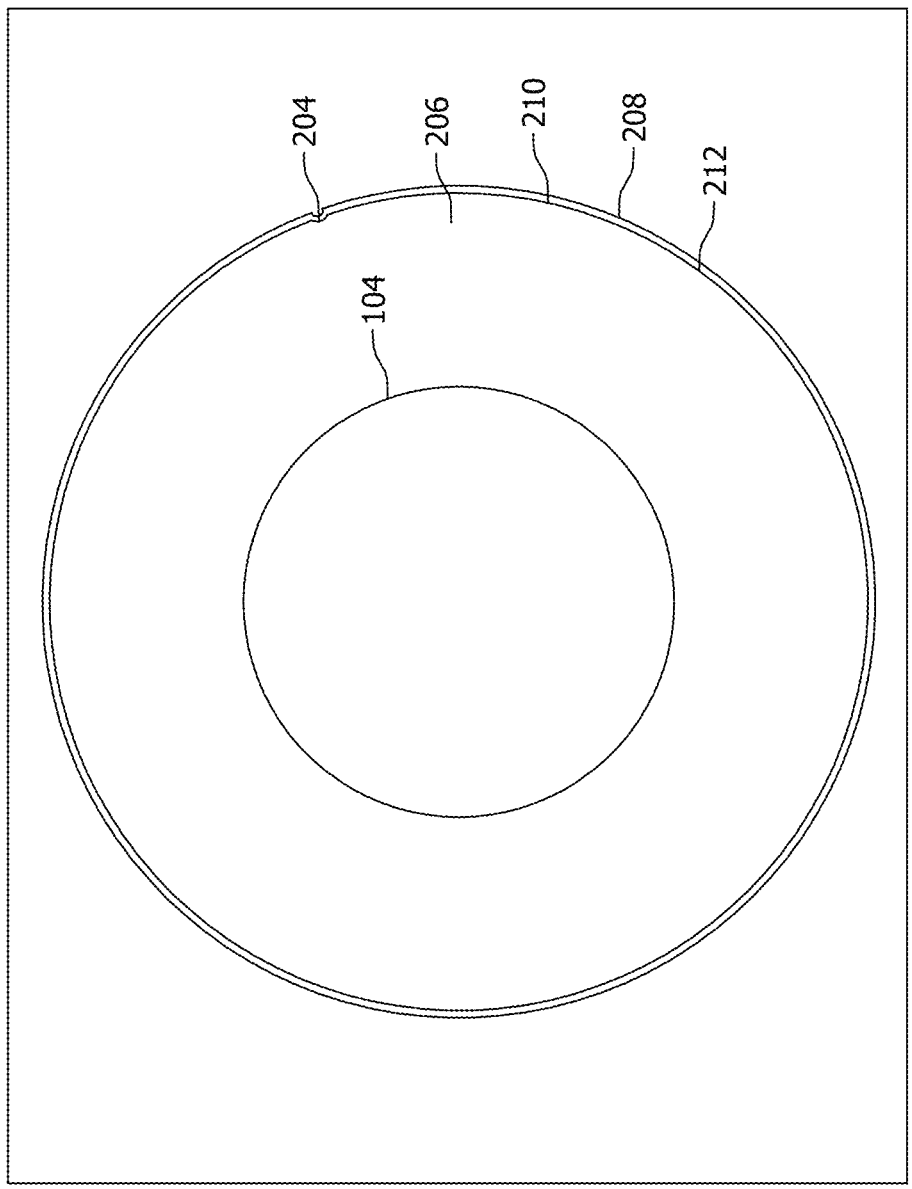
FIG. 16 is a schematic of an output image of the semiconductor wafer generated by the controller.
Figure 17:
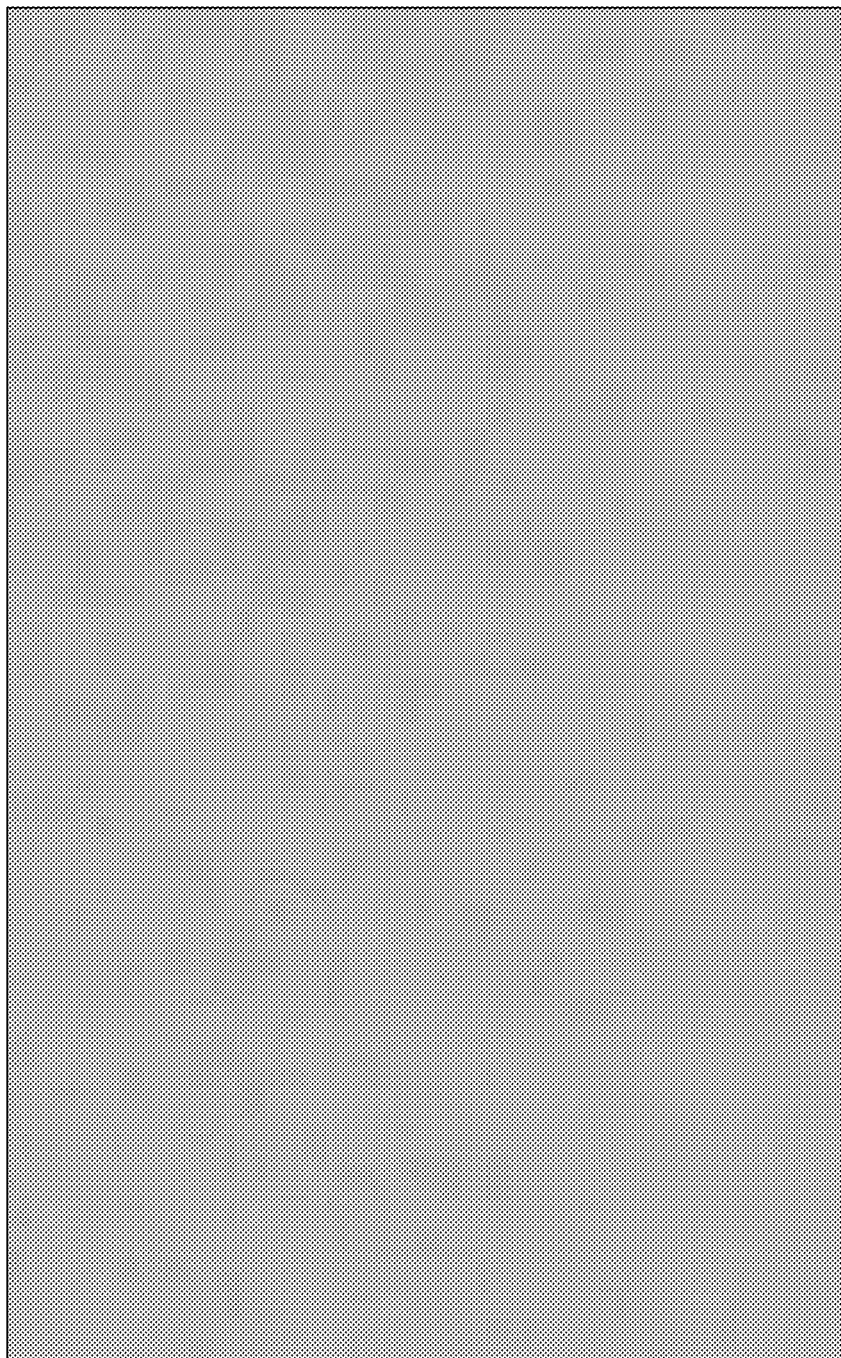
FIG. 17 is an output image of the semiconductor wafer generated by the controller.

The software filter includes a fast Fourier transform (FFT) that identifies and removes the periodic artifacts 214 from the image 202. Specifically, because the grid pattern of periodic artifacts 214 is a regularly spaced, periodic array, the FFT decomposes the image 202 into its sine and cosine components and generates an output image 216 (shown in FIG. 17) in a Fourier or frequency domain while the image 202 is in a spatial domain equivalent. The regular spacing of the grid pattern of periodic artifacts 214 enables the FFT to identify the periodic artifacts 214 from the image 202. In the output image 216, each point represents a particular frequency contained in the spatial domain image or in image 202. Specifically, the controller 112 generates 418 a raw FFT image 218 (shown in FIG. 15), detects 420 the periodic artifacts 214 in the image 202, removes or reduces 422 the periodic artifacts 214 from the image, and converts 424 the image into the output image 216 (shown in FIG. 17, a schematic representation 217 of the image 216 is shown in FIG. 16). The software filter improves the image 202 prior to analysis of the image 202 to detect defects on the wafer 104 because the software filter is insensitive to translational position variations of the wafer, diffuser plate, and/or camera, and is basically self-correcting for rotational position variations of the wafer, diffuser plate, or camera.

At high magnification, the periodic artifacts 214, which are generated by the arrangement of the reflectors 200 on the top surface 196 of the transparent plate 190, are visible. The grid pattern of periodic artifacts 214 can reduce the precision of the results of the analysis 414. When the image 202 is transformed into the frequency domain, the periodic artifacts 214 are represented as high intensity spots 228 on the raw FFT image 218. Removing the high intensity spots 228 in the raw FFT image 218, and then transforming the raw FFT image 218 back to a spatial domain image, the grid pattern of periodic artifacts 214 can be removed from the image 202.

The raw FFT image 218 is generated to enable visualization of the FFT analysis and aspects of the raw FFT image enable visualization of specific aspects of the FFT analysis. For example, the raw FFT image 218 is generated using conventional FFT methods and includes a center spot 224 and a pair of perpendicular axes 226. The magnitude of the center spot 224 visually represents the period or distance between the periodic artifacts 214 in the image 202. Additionally, the raw FFT image 218 also includes high intensity spots 228 and the perpendicular axes 226 are aligned with the high intensity spots 228. As shown in FIG. 14 the grid pattern of periodic artifacts 214 is oriented at an angle. The high intensity spots 228 are also oriented at an angle that is the same as the angle of orientation of the grid pattern of periodic artifacts 214, and the pair of perpendicular axes 226 are also oriented at the same angle as the high intensity spots 228 and the grid pattern of periodic artifacts 214. Accordingly, the raw FFT image 218 enable visualization of the FFT analysis.

Once the output image 216 has been generated, the controller 112 analyzes the output image to detect defects in the wafer 104. Specifically, the controller 112 detects 426 the base 204, the wafer boundary 208, the transfer layer 206, the transfer layer boundary 210, the terrace width 212, and the notch 222 in the output image 216. More specifically, the controller 112 detects 428 the wafer boundary 208 by segmenting and isolating the wafer boundary in the output image 216, and detects 430 the transfer layer boundary 210 by segmenting and isolating the transfer layer boundary in the output image 216. The boundaries of the transfer layer 206, the notch 222, and voids in the transfer layer are segmented using various techniques of image processing including image blurring, gradient calculation, high gradient edge detection, and contour calculation from edge detection. When the boundaries are vague or faint, further processing occurs to enhance the edge locations, and, in some embodiments where the output image 216 has incomplete or missing edges, estimates of the boundary closure are made if possible. For example, edge boundary extrapolation may be used when small edge segments are missing, and the detected edges may by smoothed to reduce noise introduced by the edge detection techniques. When controller 112 is unable to estimate closure, the output image 216 is flagged for manual inspection.

After the base 204, the wafer boundary 208, the transfer layer 206, the transfer layer boundary 210, and the terrace width 212 have been detected in the output image 216, the controller 112 analyzes 432 the detected areas for defects. More specifically, the controller 112 analyzes 432 at least one of the base 204, the wafer boundary 208, the transfer layer 206, the transfer layer boundary 210, and the terrace width 212 for defects. For example, the controller 112 detects 434 features of at least one of the base 204, the wafer boundary 208, the transfer layer 206, the transfer layer boundary 210, and the terrace width 212 and quantifies 436 the detected features into quantified metrics. The controller 112 then compares 438 the quantified metrics to predetermined metrics, and detects 440 defects in at least one of the base 204, the wafer boundary 208, the transfer layer 206, the transfer layer boundary 210, and the terrace width 212 based on the comparison.

Specifically, detecting 434 features of at least one of the base 204, the wafer boundary 208, the transfer layer 206, the transfer layer boundary 210, and the terrace width 212 and quantifying 436 the detected features into quantified metrics includes detecting the terrace width 212 and quantifying detected features of the terrace width 212 into various global and local terrace width statistics. For example, in some embodiments, the terrace width 212 is divided into twelve 30° segments around the wafer's 104 edge, and the detected features of the terrace width 212 are quantified into local terrace width statistics based on each segment.

Figure 12:
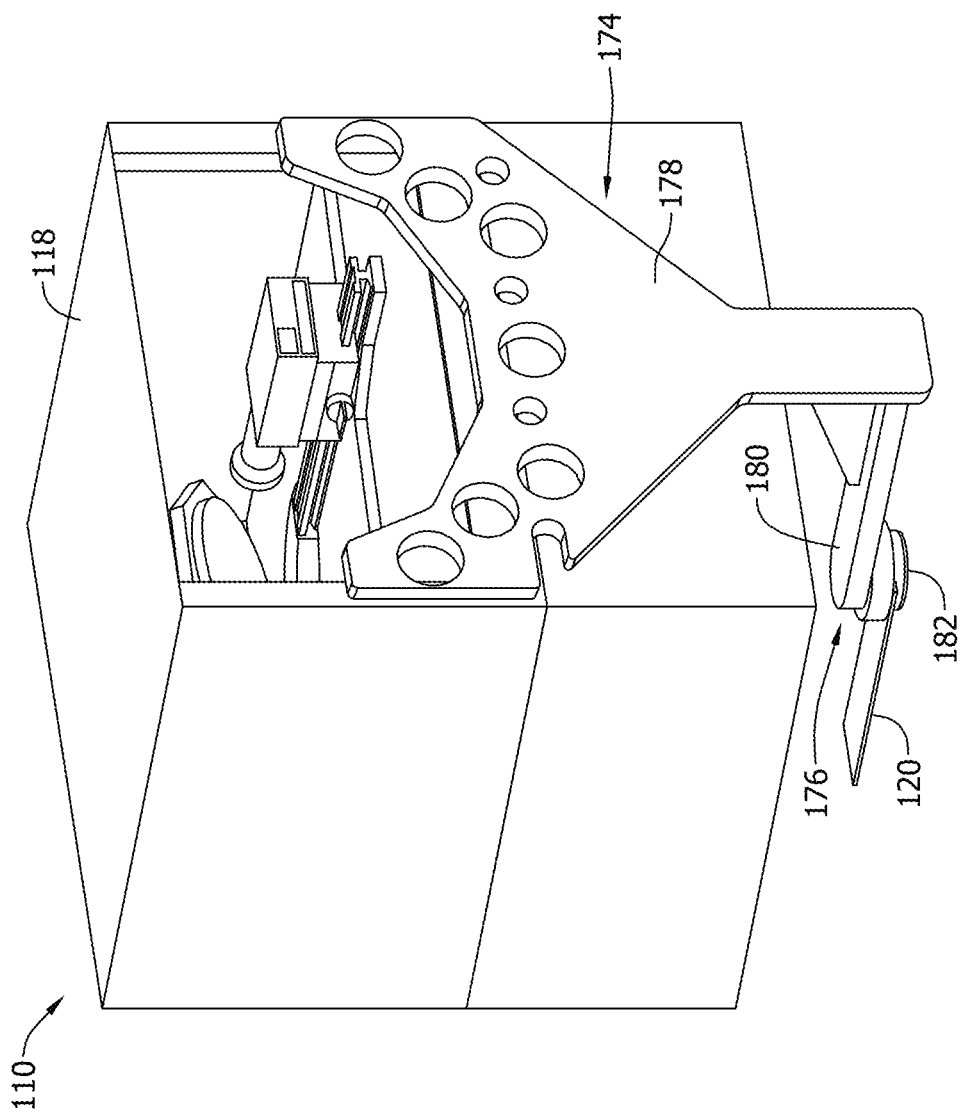
FIG. 12 is another perspective view of the semiconductor wafer imaging system shown in FIGS. 3 and 4 with the end effector positioner and an isolated end effector.
Figure 22:
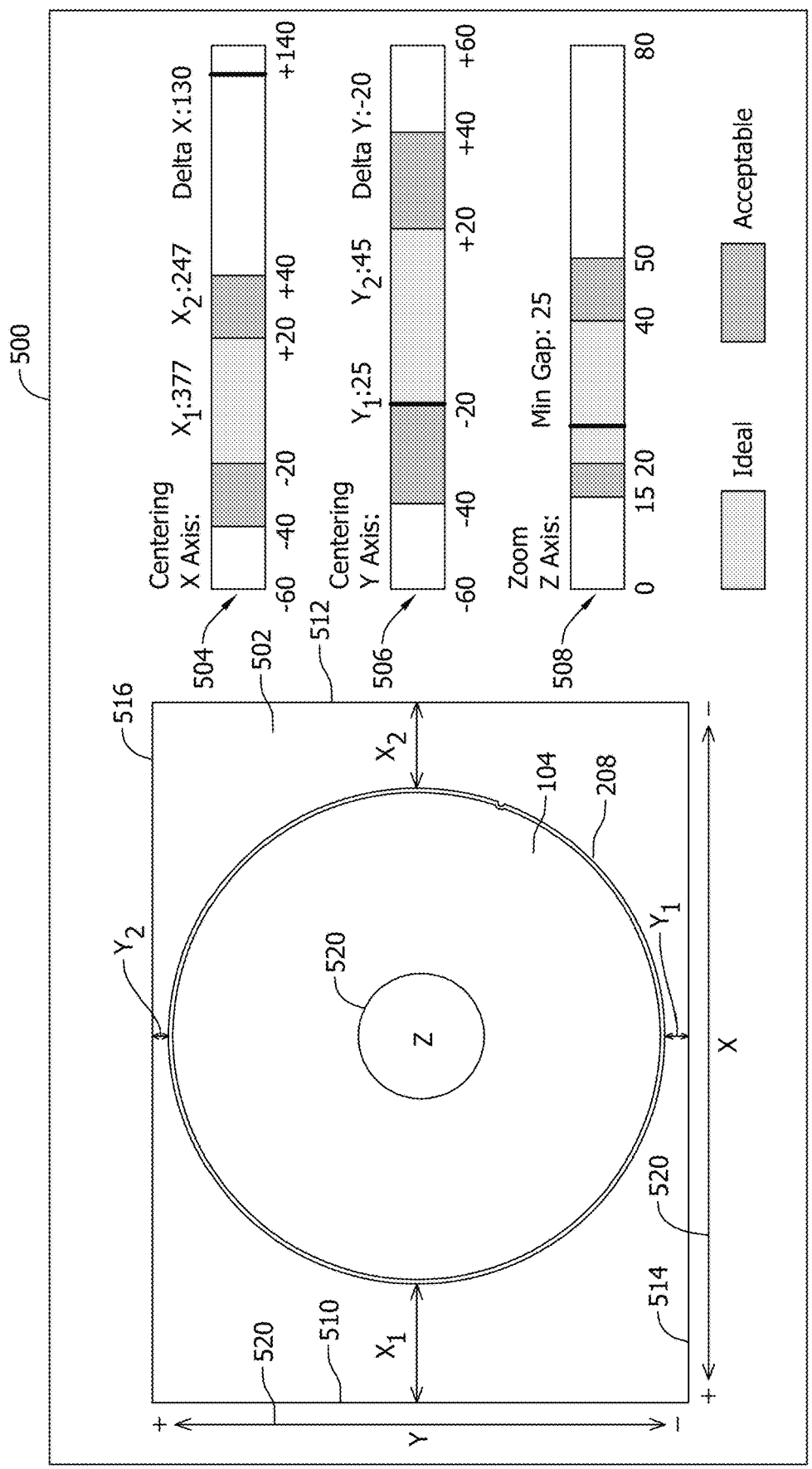
FIG. 22 is a display for use in calibrating a position of the wafer by an image analysis process.

FIG. 22 shows a graphical user interface display 500 for use in calibrating the position of the end effector 120 (shown in FIG. 12) and/or wafer 104 relative to the camera 146 (shown in FIG. 9) by an image analysis process. The user interface display 500 shows a captured image 502 of wafer 104 and centering meters 504-508. To calibrate the position of end effector 120 and/or wafer 104 by image analysis, the end effector 120 is positioned below the bottom shroud opening 140 (shown in FIG. 5) and at least partially within the field of view 184 (shown in FIG. 9) of the camera 146. The camera 146 captures the image 502 of the wafer 104, which is transmitted to the controller 112. The controller 112 then analyzes the captured image 502 of the wafer 104 to determine whether the wafer 104 is within predefined positioning ranges and appropriately centered within the field of view 184. If the controller 112 determines that the wafer is not appropriately centered within the field of view 184, the position of the wafer 104 and/or the end effector 120 is adjusted based on the determination. After the adjustment, a new image is captured and the controller 112 again determines whether the detected position of the wafer 104 is within predefined positioning ranges. The image analysis process may be used either with, or as an alternative to, the end effector positioner 174, described above with respect to FIG. 12.

During operation, to determine whether the wafer 104 is appropriately centered within the field of view 184, the controller 112 captures the image 502 of the wafer 104 and detects the boundary 208 of the wafer 104, as described above with respect to FIGS. 14-21. The controller 112 then measures distances on the captured image 502 between edges 510-516 of the image 502 and the wafer boundary 208.

For example, with respect to positioning along the X-axis, the controller 112 measures a first horizontal distance $X_1$ from a first side edge 510 of the captured image 502 to the wafer boundary 208 and a second horizontal distance $X_2$ from a second side edge 512 of the image 502 to the wafer boundary 208. The controller 112 then determines a delta X value that is equal to the difference between the first horizontal distance $X_1$ and the second horizontal distance $X_2$. With respect to positioning along the Y-axis, the controller 112 measures a first vertical distance $Y_1$ from a bottom edge 514 of the image 502 to the wafer boundary 208 and a second vertical distance $Y_2$ from a top edge 516 of the image 502 to the wafer boundary 208. The controller 112 then determines a delta Y value that is equal to the difference between the first vertical distance $Y_1$ and the second vertical distance $Y_2$. With respect to positioning along the Z-axis, the controller determines the smallest distance of $X_1$, $X_2$, $Y_1$, and $Y_2$ to determine a minimum gap of the wafer 104 from the edges 510-516 of the image 502. The controller 112 then compares the determined delta X, delta Y, and the minimum gap values to predefined tolerance ranges (e.g., as shown by the centering meters 504-508), to determine whether further adjustment of the wafer 104 and/or end effector 120 in the X, Y, or Z directions is needed. Color coded indicators 520 are provided on or near the image 502 on the user interface 500 to indicate to a technician whether the wafer 104 is centered within the respective ranges along the X, Y, and Z axes. For example, the indicators 520 change colors based on whether the respective delta X, delta Y, or minimum gap value is within the corresponding ideal, acceptable, or out-of-bounds ranges.

In the embodiment of FIG. 22, the centering meters 504-508 include an X-axis centering meter 504, a Y-axis centering meter 506, and a Z-axis, or zoom, centering meter 508. Each of the centering meters 504-508 indicate an ideal range, an acceptable range, and an out of bounds range. The controller 112 maps the determined delta X, delta Y, and minimum gap values onto the X-axis centering meter 504, the Y-axis centering meter 506, and the Z-axis centering meter 507, respectively. As shown in FIG. 22, the delta Y value for the image 502 is equal to −20 and is within the ideal range of −20 to 20 on the Y-axis centering meter 506. The minimum gap value is equal to 25 and is within the ideal range of 20 to 40 on the Z-axis centering meter 508. The delta X value is equal to 130 and is outside both the ideal and acceptable ranges on the X-axis centering meter 504. The positioning of the wafer 104 and/or end effector 120 is then adjusted (e.g., by a technician or by an automated positioning system in communication with the controller 112). In particular, the wafer positioning is adjusted based on the determined values displayed on the centering meters 504-508. As an example, based on the displayed results from the centering meters 504-508 as shown in FIG. 22, a technician may move the wafer 104 to the left of the page as shown in FIG. 22 to reduce the displayed delta X value. After the adjustment, another image is captured and the process is repeated until each of the delta X, delta Y, and minimum gap values are all within the acceptable and/or ideal ranges.

The semiconductor wafer imaging systems described herein image wafers to detect defects in the wafers during the manufacturing process. The imaging system images wafers after the wafers have been cleaved to detect defects in the wafers formed during the cleaving process. If the semiconductor wafer imaging system detects defects in a wafer, the wafer is removed from the manufacturing process, reducing wafer production costs. The wafers have a reflective, mirror-like surface, and the semiconductor wafer imaging system images the wafer without imaging a light source reflected off of the reflective surface. Specifically, the semiconductor wafer imaging system includes a black box that surrounds a camera and an illumination panel. The black box minimizes reflections in the semiconductor wafer imaging system, and the illumination panel directs diffuse light toward the wafer. The diffuse light is reflected off of the wafer toward the camera. The camera detects the reflected diffuse light, and does not image the illumination panel because the light generated by the illumination panel is diffuse. Accordingly, the camera images the wafer, not the light source, enabling a controller to analyze the wafer for defects and reducing manufacturing costs.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A semiconductor wafer processing system for processing a semiconductor wafer, the system comprising:
    a semiconductor wafer processing station for processing the semiconductor wafer; and a semiconductor wafer imaging system for imaging a semiconductor wafer, wherein the semiconductor wafer imaging system images the semiconductor wafer after the semiconductor wafer processing station processes the semiconductor wafer, the system comprising:
shroud panels defining a black box, wherein one of the shroud panels defines a shroud opening;
a camera positioned in the black box for imaging the semiconductor wafer;
an end effector moveable relative to the black box for positioning the semiconductor wafer in alignment with the shroud opening and in a field of view of the camera; and
an illumination panel positioned in the black box between the camera and the shroud opening and within the field of view of the camera, the illumination panel including a light source and a reflector for scattering light from the light source to direct diffuse light through the shroud opening and to the semiconductor wafer, wherein a portion of the diffuse light is reflected off the semiconductor wafer and the camera images the semiconductor wafer by detecting the reflected diffuse light.

2. The system of claim 1, wherein the semiconductor wafer processing station includes a cleaving station and the semiconductor wafer imaging system is positioned above the cleaving station.

3. The system of claim 1, wherein the semiconductor wafer processing station includes a cleaving station positioned upstream of the semiconductor wafer imaging system, and wherein the end effector receives the semiconductor wafer after the wafer is cleaved by the cleaving station and the camera images the cleaved wafer.

4. The system of claim 1 further comprising a semiconductor wafer imaging station, wherein the semiconductor wafer imaging system is positioned in the semiconductor wafer imaging station, and wherein the illumination panel includes a transparent plate having a first surface and an opposed second surface, wherein the first surface is textured with an array of reflectors for directing at least a portion of the diffuse light through the second surface and to the wafer on the end effector.

5. The system of claim 1 further comprising a frame and a locating plate attached to the frame, wherein the semiconductor wafer imaging system is attached to the locating plate.

6. The system of claim 5, wherein the semiconductor wafer imaging system is movably attached to the locating plate and a position of the semiconductor wafer imaging system is adjusted by adjusting the position of the semiconductor wafer imaging system on the locating plate.

7. The system of claim 5, wherein the end effector is attached to the frame, and wherein the semiconductor wafer is visible through a direct, unobstructed line of sight from the wafer to an upper chamber when the wafer is positioned on the end effector, wherein the end effector receives the semiconductor wafer from the semiconductor wafer processing station.

8. A semiconductor wafer processing system for processing a semiconductor wafer, the system comprising:
a first manufacturing line for processing a first semiconductor wafer and including a first semiconductor wafer processing station for processing the first semiconductor wafer;
a second manufacturing line for processing a second semiconductor wafer and including a second semiconductor wafer processing station for processing the second semiconductor wafer, the second manufacturing line intersects the first manufacturing line at a common location;
a semiconductor wafer imaging system for imaging the first and second semiconductor wafers and positioned within the common location where the first and second manufacturing lines intersect, wherein the semiconductor wafer imaging system images the first and second semiconductor wafers after the first and second semiconductor wafer processing stations process the first and second semiconductor wafers, the system comprising:
shroud panels defining a black box, wherein one of the shroud panels defines a shroud opening;
a camera positioned in the black box for imaging the semiconductor wafer;
an end effector moveable relative to the black box for positioning the semiconductor wafer in alignment with the shroud opening and in a field of view of the camera; and
an illumination panel positioned in the black box between the camera and the shroud opening and within the field of view of the camera, the illumination panel including a light source and a reflector for scattering light from the light source to direct diffuse light through the shroud opening and to the semiconductor wafer, wherein a portion of the diffuse light is reflected off the semiconductor wafer and the camera images the semiconductor wafer by detecting the reflected diffuse light.

9. The system of claim 8, wherein at least one of the first and second semiconductor wafer processing stations includes a cleaving station, and wherein the cleaving station is positioned upstream of the semiconductor wafer imaging system.

10. The system of claim 8 further comprising a semiconductor wafer imaging station positioned within the common location where the first and second manufacturing lines intersect, wherein the semiconductor wafer imaging system is positioned in the semiconductor wafer imaging station.

11. The system of claim 8 further comprising a frame and a locating plate attached to the frame, wherein the semiconductor wafer imaging system is attached to the locating plate.

12. The system of claim 11, wherein the semiconductor wafer imaging system is movably attached to the locating plate and a position of the semiconductor wafer imaging system is adjusted by adjusting the position of the semiconductor wafer imaging system on the locating plate.

13. The system of claim 11, further comprising an end effector attached to the frame for positioning the first and second semiconductor wafers within a field of view of the camera.

14. The system of claim 13, wherein the end effector receives the semiconductor wafer from at least one of the first and second semiconductor wafer processing stations.

15. The system of claim 8, wherein the semiconductor wafer imaging system is positioned downstream of the first and second semiconductor wafer processing stations and alternates between imaging the first and second semiconductor wafers from the first and second manufacturing lines.

16. A semiconductor wafer imaging station of a semiconductor wafer processing system for imaging a semiconductor wafer, the station comprising:
a frame;
a locating plate attached to the frame;

a black box movably attached to the locating plate, the black box comprising:

shroud panels defining the black box, wherein one of the shroud panels defines a shroud opening;

a camera positioned in the black box for imaging the semiconductor wafer; and an illumination panel positioned in the black box between the camera and the shroud opening and within the field of view of the camera, the illumination panel including a light source and a reflector for scattering light from the light source to direct diffuse light through the shroud opening and to the semiconductor wafer, wherein a portion of the diffuse light is reflected off the semiconductor wafer and the camera images the semiconductor wafer by detecting the reflected diffuse light; and an end effector moveable relative to the black box for positioning the semiconductor wafer in alignment with the shroud opening and within a field of view of the camera.

17. The station of claim 16, wherein a position of the black box is adjusted by adjusting the position of the black box on the locating plate.

18. The station of claim 16, wherein the end effector is attached to the frame and positions the semiconductor wafer within a field of view of the camera.

19. The system of claim 1, wherein the illumination panel includes a transparent plate, the reflector being positioned on the transparent plate such that the reflector directs diffuse light from the light source and through a first surface of the transparent plate, the first surface oriented to face the shroud opening.

20. The system of claim 19, wherein the transparent plate further includes a second surface and a side edge extending from the first surface to the second surface, the light source being positioned to direct light emitted from the light source into the transparent plate through the side edge and to the reflector, the transparent plate being positioned such that the portion of diffuse light reflected off the semiconductor wafer passes through the first surface and the second surface of the transparent plate and to the camera.

* * * * *